United States Patent
Park et al.

(10) Patent No.: US 9,634,077 B2
(45) Date of Patent: Apr. 25, 2017

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin, Gyeonggi-Do (KR)

(72) Inventors: Gyung-Soon Park, Seoul (KR); Keum-Nam Kim, Soul (KR); Min-Jae Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/595,930

(22) Filed: Jan. 13, 2015

(65) Prior Publication Data
US 2016/0043157 A1    Feb. 11, 2016

(30) Foreign Application Priority Data

Aug. 5, 2014   (KR) .................. 10-2014-0100590

(51) Int. Cl.
| | | |
|---|---|---|
| *H01L 33/00* | (2010.01) | |
| *H01L 27/32* | (2006.01) | |
| *H01L 29/786* | (2006.01) | |

(52) U.S. Cl.
CPC .... *H01L 27/3265* (2013.01); *H01L 29/78645* (2013.01)

(58) Field of Classification Search
CPC ............. H01L 27/3265; H01L 27/3248; H01L 2227/323; H01L 2251/5323; H01L 29/78645; H01L 29/518; H01L 27/326; H01L 27/3262; H01L 29/4908; H01L 27/1259; H01L 27/3258

See application file for complete search history.

(56) References Cited

U.S. PATENT DOCUMENTS

| | | | | |
|---|---|---|---|---|
| 9,178,181 | B2 * | 11/2015 | Lee | ............... H01L 51/5275 |
| 2008/0142808 | A1 * | 6/2008 | Lee | .................. H01L 27/12 |
| | | | | 257/72 |
| 2011/0122330 | A1 | 5/2011 | Tae et al. | |
| 2011/0147757 | A1 | 6/2011 | Kim et al. | |
| 2012/0001191 | A1 | 1/2012 | Ma et al. | |
| 2015/0097172 | A1 * | 4/2015 | Han | ................... H01L 27/3262 |
| | | | | 257/40 |

(Continued)

FOREIGN PATENT DOCUMENTS

| | | |
|---|---|---|
| KR | 1020070037115 A | 4/2007 |
| KR | 1020110057062 A | 5/2011 |

(Continued)

*Primary Examiner* — Latanya N Crawford

(74) *Attorney, Agent, or Firm* — Innovation Counsel LLP

(57) ABSTRACT

An organic light emitting display device may include a substrate having a pixel region and a transparent region, a first capacitor disposed in the transparent region of the substrate, a semiconductor device disposed in the pixel region of the substrate, a second capacitor disposed on the semiconductor device, and an organic light emitting structure disposed on the second capacitor. The organic light emitting display device may have a sufficient capacitance for components including the semiconductor device and the organic light emitting structure without increasing an area of the pixel region while maintaining a transmittance of the organic light emitting display device.

20 Claims, 14 Drawing Sheets

(56) References Cited

U.S. PATENT DOCUMENTS

| 2015/0243711 | A1* | 8/2015 | Hong | H01L 27/323 |
| | | | | 257/40 |
| 2016/0005802 | A1* | 1/2016 | Park | H01L 27/3265 |
| | | | | 257/40 |
| 2016/0020266 | A1* | 1/2016 | Park | H01L 27/3262 |
| | | | | 257/40 |
| 2016/0035809 | A1* | 2/2016 | Park | H01L 27/3265 |
| | | | | 257/40 |

FOREIGN PATENT DOCUMENTS

| KR | 1020110069362 A | 6/2011 |
| KR | 1020120002759 A | 1/2012 |

\* cited by examiner

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION(S)

This application claims priority under 35 U.S.C. §119 to Korean patent Application No. 10-2014-0100590, filed on Aug. 5, 2014, the disclosure of which is hereby incorporated by reference herein in its entirety.

BACKGROUND

1. Technical Field

Example embodiments relate to organic light emitting display devices and method of manufacturing organic light emitting display devices. More particularly, example embodiments relate to an organic light emitting display devices including a capacitor disposed in a transparent region, and method of manufacturing the organic light emitting display devices.

2. Description of the Related Art

An organic light emitting display (OLED) device may display various informations such as images or characters by combining electrons provided from a cathode with holes provided from an anode in an organic light emitting layer. The organic light emitting display device has been expected as one of promising next generation display devices because of some advantages such as a wide viewing angle, a rapid response speed, a thin thickness, a low power consumption, etc.

Recently, a transparent organic light emitting display device has been rapidly developed. In the transparent organic light emitting display device, an image of an object before or after a transparent region of the organic light emitting display device may be recognized by a user when the organic light emitting display device operates in an "ON" state. In an "OFF" state, an image may be displayed in a pixel region of the organic light emitting display device using a light generated from the organic light emitting layer.

Generally, a conventional transparent organic light emitting display device includes a substrate having a pixel region in which pixels are arranged and a transparent region adjacent to the pixel region. Components including semiconductor devices, capacitors and peripheral circuits may be disposed in the pixel region. That is, in the conventional transparent organic light emitting display device, the semiconductor devices and the capacitors are positioned in the pixel region. In this case, the capacitors may occupy limited areas in the pixel region, so that the capacitors may not provide sufficient capacitances for other components of the organic light emitting display device.

SUMMARY

Example embodiments provide an organic light emitting display device including capacitors in a pixel region and a transparent region to improve a capacitance for components thereof.

Example embodiments provide a method of manufacturing an organic light emitting display device including capacitors in a pixel region and a transparent region.

Example embodiments provide an organic light emitting display device including a capacitor in a transparent region to provide a sufficient capacitance for components thereof.

According to one embodiment, there is provided an organic light emitting display device. The organic light emitting display device may include a substrate having a pixel region and a transparent region, a first capacitor disposed in the transparent region of the substrate, a semiconductor device disposed in the pixel region of the substrate, a second capacitor disposed on the semiconductor device, and an organic light emitting structure disposed on the second capacitor.

In example embodiments, the semiconductor device may include an active pattern disposed on the substrate, a gate insulation layer disposed on the active pattern, a gate structure disposed on the gate insulation layer, a source electrode contacting a source region of the active pattern, and a drain electrode contacting a drain region of the active pattern. The gate insulation layer may extend to the transparent region. The first capacitor may include a first lower electrode disposed on the substrate, a first dielectric structure disposed on the first lower electrode, and a first upper electrode disposed on the first dielectric structure. For example, the first lower electrode may include polysilicon doped with impurities. The first dielectric structure may include a portion of the gate insulation layer positioned in the transparent region. The gate structure of the semiconductor device may include a first gate electrode disposed on the gate insulation layer, and a second gate electrode disposed on the first gate electrode. The first upper electrode may include a material substantially the same as a material of the first gate electrode. For example, each of the first electrode and the first gate electrode may include a material having a transmittance. The second capacitor may include a second lower electrode, a second dielectric structure disposed on the second lower electrode, and a second upper electrode disposed on the second dielectric structure. The second lower electrode of the second capacitor may be the gate structure of the semiconductor device. The second dielectric structure may include a portion of an insulating interlayer disposed on the gate structure.

In example embodiments, the organic light emitting display device may additionally include at least one insulating interlayer disposed on the second capacitor, and a first connection wiring disposed on the at least one insulating interlayer. The first connection wiring may electrically connect the semiconductor device to the first capacitor. The organic light emitting display device may further include a second connection wiring disposed on the at least one insulating interlayer. The second connection wiring may be adjacent to the first connection wiring. The second connection wiring may electrically connect the first capacitor to the second capacitor.

According to another embodiment, there is provided an organic light emitting display device that may include a substrate having a pixel region and a transparent region, a capacitor disposed in the transparent region of the substrate, a semiconductor device disposed in the pixel region of the substrate, and an organic light emitting structure disposed on the semiconductor device.

In some example embodiments, the semiconductor device may include an active pattern disposed on the substrate, a gate insulation layer disposed on the active pattern, a gate structure disposed on the gate insulation layer, a source electrode contacting a source region of the active pattern, and a drain electrode contacting a drain region of the active pattern. The gate insulation layer may extend to the transparent region. The capacitor may include a lower electrode disposed on the substrate, a dielectric structure disposed on the lower electrode and an upper electrode disposed on the dielectric structure. The dielectric structure may include a portion of the gate insulation layer positioned in the transparent region. The lower electrode may include polysilicon doped with impurities, and the upper electrode may include a material having a transmittance. The organic light emitting display device may additionally include at least one insulating interlayer disposed between the semiconductor device and the organic light emitting structure, and a connection wiring disposed on the at least one insulating interlayer. The connection wiring may electrically connect the semiconductor device to the capacitor. The connection wiring may contact the gate structure of the semiconductor device and the upper electrode of the capacitor.

According to still another aspect, there is provided a method of manufacturing an organic light emitting display device. In the methods, a substrate having a pixel region and a transparent region may be provided. A semiconductor device may be formed in the pixel region of the substrate. A first capacitor may be formed in the transparent region of the substrate. A second capacitor may be formed on the semiconductor device. An organic light emitting structure may be formed on the second capacitor.

In the formations of the semiconductor device and the first capacitor according to example embodiments, an active pattern of the semiconductor device and a first lower electrode of the capacitor may be formed on the substrate. A gate insulation layer may be formed on the active pattern and the first lower electrode. A first upper electrode of the first capacitor may be formed on the gate insulation layer in the transparent region. A gate structure of the semiconductor device may be formed on the gate insulation layer in the pixel region.

In example embodiments, the first upper electrode and the gate structure may be formed by forming a first electrode layer on the gate insulation layer, by forming a second electrode layer on the first electrode layer, and by etching the first electrode layer and the second electrode layer. The first electrode layer may be formed using material different from a material of the second electrode layer. The first electrode layer and the second electrode layer may be etched using a halftone mask or a halftone slit mask.

In some example embodiments, the first upper electrode and the gate structure may be formed by forming a first electrode layer on the gate insulation layer, by forming the first upper electrode by patterning the first electrode layer, by forming a second electrode layer on the gate insulation layer, and by forming the gate structure by patterning the second electrode layer.

In the formation of the second capacitor according to example embodiments, an insulating interlayer may be formed on the gate structure. A second upper electrode may be formed on the insulating interlayer.

In example embodiments, at least one insulating interlayer may be additionally formed on the second capacitor. A first connection wiring may be formed on the at least one insulating interlayer. The first connection wiring may electrically connect the semiconductor device to the first capacitor.

In the formation of the first connection wiring according to example embodiments, a first contact hole and a second contact hole may be formed through the at least one insulating interlayer. The first contact hole may expose the gate structure and the second contact hole may expose the first upper electrode. The first connection wiring may be formed on the gate structure exposed through the first contact hole, a sidewall of the first contact hole, the first upper electrode exposed through the second contact hole, a sidewall of the second contact hole, and the at least one insulating interlayer.

In example embodiments, a second connection wiring may be formed on the at least one insulating interlayer. The second connection wiring may electrically connect the first capacitor to the second capacitor.

According to example embodiments, an organic light emitting display device may include a capacitor disposed in a transparent region and an additional capacitor located in a pixel region. Therefore, the organic light emitting display device may have a sufficient capacitance for components including a semiconductor device and an organic light emitting structure without increasing an area of the pixel region while maintaining a transmittance of the organic light emitting display device. Meanwhile, an organic light emitting display device may include a capacitor positioned in the transparent region only, so that the organic light emitting display device may have a simple configuration while ensuring a sufficient capacitance by adjusting dimensions of the capacitor.

BRIEF DESCRIPTION OF THE DRAWINGS

Illustrative, non-limiting example embodiments will be more clearly understood from the following detailed description taken in conjunction containing the accompanying drawings.

DETAILED DESCRIPTION OF THE EMBODIMENTS

Hereinafter, organic light emitting display devices and methods of manufacturing organic light emitting display devices in accordance with example embodiments will be described in detail with reference to the accompanying drawings. The inventive concept may, however, be embodied in many different forms and should not be construed as limited to the embodiments set forth herein. Rather, these embodiments are provided so that this description will be thorough and complete, and will fully convey the scope of the inventive concept to those skilled in the art.

Figure 1:
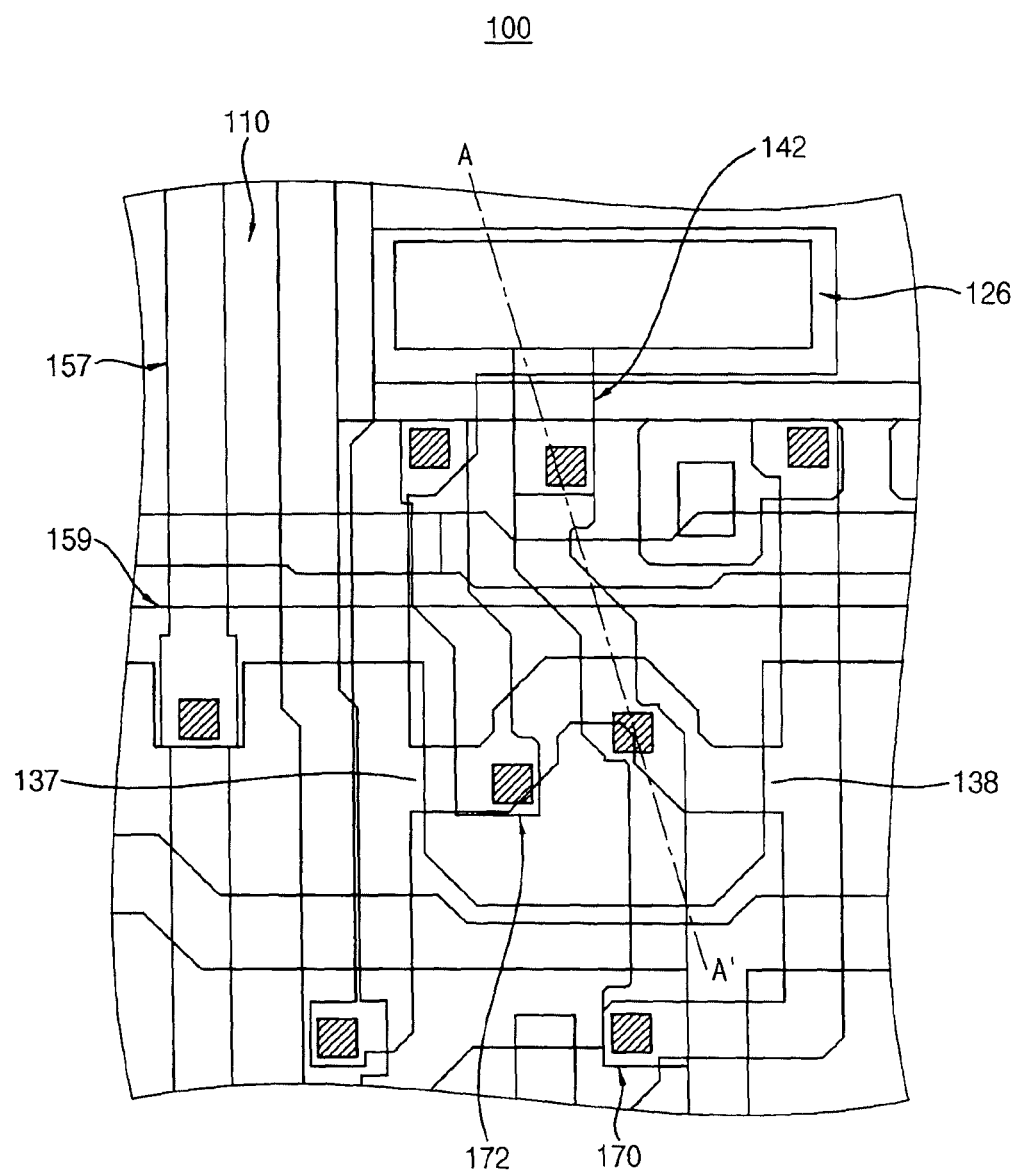
FIG. 1 is a plan view illustrating an organic light emitting display device in accordance with example embodiments.
Figure 2:
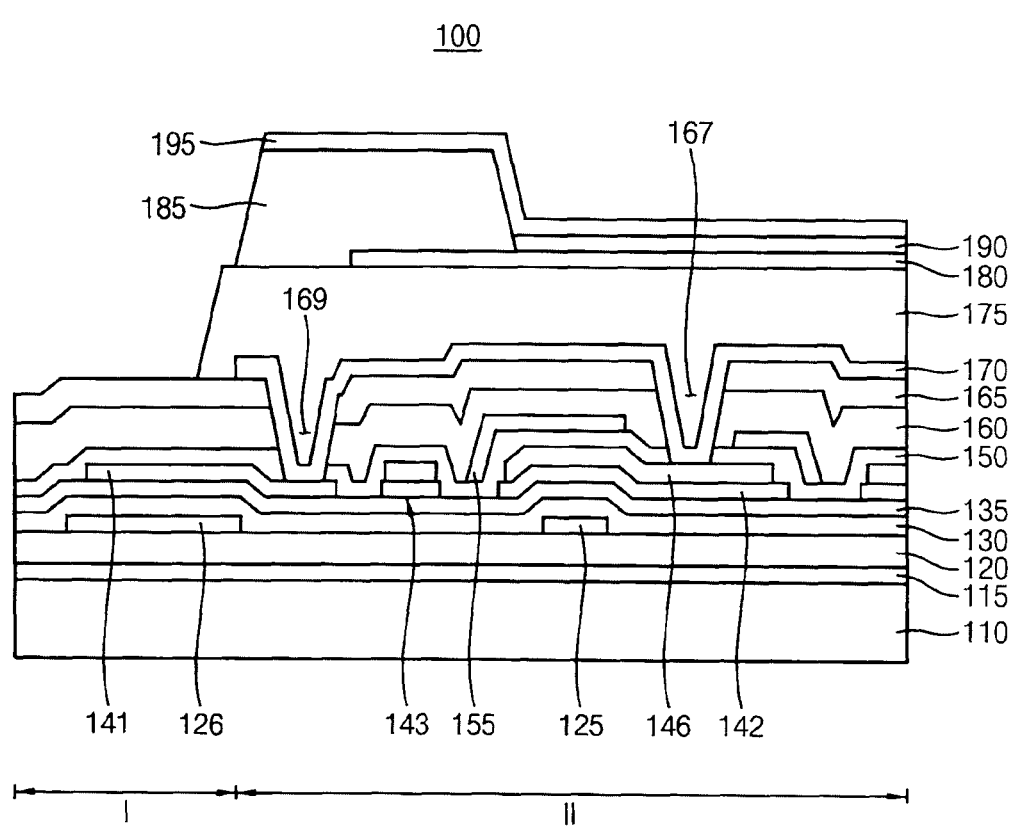
FIG. 2 is a cross sectional view illustrating the organic light emitting display device taken along a line of A-A' in FIG. 1.

FIG. 1 is a plan view illustrating an organic light emitting display device 100 in accordance with example embodiments. FIG. 2 is a cross sectional view illustrating the organic light emitting display device 100 taken along a line of A-A' in FIG. 1.

Referring to FIGS. 1 and 2, the organic light emitting display device 100 may include a substrate 110, a semiconductor device, a first capacitor, a second capacitor, an organic light emitting structure, etc. In example embodiments, the organic light emitting display device 100 may have a transparent region I and a pixel region II. The first capacitor may be disposed in the transparent region I while the semiconductor device, the second capacitor and the organic light emitting structure may be located in the pixel region II. For example, the second capacitor in the pixel region II may serve as a main capacitor for components of the organic light emitting display device 100, and the first capacitor may function as an auxiliary capacitor for the components.

In example embodiments, the semiconductor device may include an active pattern 125, a first gate insulation layer 130, a second gate insulation layer 135, a gate structure, a source electrode 137 and a drain electrode 138. In this case, the gate structure may include a first gate electrode 142 and a second gate electrode 146. The first capacitor in the transparent region I may include a first lower electrode 126, a first dielectric structure and a first upper electrode 141. The first dielectric structure may include portions of the first and the second gate insulation layers 130 and 135 in the transparent region I. Additionally, the second capacitor in the pixel region II may include a second lower electrode, a second dielectric structure and a second upper electrode 155. The second lower electrode may be the gate structure of the semiconductor device. That is, at least one of the first gate electrode 142 and the second gate electrode 146 may be the second lower electrode of the second capacitor. The second dielectric structure may include a portion of a first insulating interlayer 150 located in the pixel region II. The organic light emitting structure may include a first electrode 180, an organic light emitting layer 190 and a second electrode 195.

As illustrated in FIGS. 1 and 2, the substrate 110 may include a transparent insulation material. For example, the substrate 110 may include a glass substrate, a quartz substrate, a transparent resin substrate, etc. Examples of the transparent resin substrate may include polyimide-based resin, acryl-based resin, polyacrylate-based resin, polycarbonate-based resin, polyether-based resin, polyethylene-terephthalate-based resin, etc. The substrate 110 may have a pixel region II and a transparent region I as the organic light emitting display device 100. For example, images may be displayed in the pixel region II using the organic light emitting structure. Further, images of objects, which are positioned before or after the front and the rear of the organic light emitting display device 100, may pass through the transparent region I.

A first buffer layer 115 and a second buffer layer 120 may be disposed on the substrate 110. The first and the second buffer layers 115 and 120 may prevent metal ions and/or impurities in the substrate 110 from diffusing upwardly and also may make the active pattern 125 of the semiconductor device and the first lower electrode 126 of the first capacitor substantially uniform. Further, the first and the second buffer layers 115 and 120 may improve the flatness of the surface of the substrate 110. Each of the first and the second buffer layers 115 and 120 may include silicon compound such as silicon oxide, silicon nitride, silicon oxynitride, silicon carbide, etc. The first buffer layer 115 may include a material substantially the same as that of the second buffer layer 120. Alternatively, the first buffer layer 115 may include a material different from that of the second buffer layer 120.

The semiconductor device may be disposed on the second buffer layer 120. Although only one semiconductor device is shown in FIGS. 1 and 2, a plurality semiconductor device may be disposed in the pixel region II. These semiconductor devices may serve as switching devices and driving devices of the organic light emitting display device 100. In example embodiments, each of the semiconductor devices may include the active pattern 125, the first gate insulation layer 130, the second gate insulation layer 135, the gate structure having the first and the second gate electrodes 142 and 146, the source electrode 137 and the drain electrode 138. Here, a second insulating interlayer 160 and a third insulating interlayer 165 may be interposed among the gate structure, the source electrode 137 and the drain electrode 138.

As illustrated in FIG. 2, the active pattern 125 and the first lower electrode 126 may be positioned on the second buffer layer 120. In example embodiments, each of the active pattern 125 and the first lower electrode 126 may include a material containing silicon. For example, the active pattern 125 and the first lower electrode 126 may include polysilicon. Here, the first lower electrode 126 of the first capacitor may additionally include P+ type impurities such as boron (B), gallium (Ga), indium (In), etc. The active pattern 125 may be located on a portion of the second buffer layer 120 in the pixel region II while the first lower electrode 126 may be positioned on a portion of the second buffer layer 120 in the transparent region I.

The first gate insulation layer 130 may be disposed on the second buffer layer 120 to cover the active pattern 125 and the first lower electrode 126. For example, the first gate insulation layer 130 may include silicon nitride, silicon oxynitride, silicon oxide, metal oxide, etc. The first gate insulation layer 130 may be disposed in the transparent and the pixel regions I and II.

The second gate insulation layer 135 may be disposed on the first gate insulation layer 130. For example, the second gate insulation layer 135 may include silicon nitride, silicon oxynitride, silicon oxide, metal oxide, etc. The second gate insulation layer 135 may include a material different from that of the first gate insulation layer 130. Alternatively, the second gate insulation layer 135 may include a material substantially the same as a material of the first gate insulation layer 130. In the transparent region I, portions of the first and the second gate insulation layers 130 and 135 may serve as the first dielectric structure of the first capacitor.

The first upper electrode 141 and the first gate electrode 142 may be disposed on the second gate insulation layer 135. The first upper electrode 141 in the transparent region I may be located on the first lower electrode 126 by interposing the portions of the first and the second gate insulation layers 130 and 135 therebetween. The first gate electrode 142 in the pixel region II is positioned on the active pattern 125 with portions of the first and the second gate insulation layers 130 and 135 therebetween. The first upper electrode 141 and the first gate electrode 142 may have areas substantially greater than those of the first lower electrode 126 and the active pattern 125, respectively. The first upper electrode 141 and the first gate electrode 142 may be positioned at the same level over the substrate 110. Further, each of the first upper electrode 141 and the first gate electrode 142 may include a material having a transmittance. For example, each of the first upper electrode 141 and the first gate electrode 142 may include a transparent conductive material such as indium tin oxide, indium zinc oxide, zinc oxide, tin oxide, gallium oxide, indium oxide, etc. When the first capacitor having the above-described configuration is provided in the transparent region I of the organic light emitting display device 100, the organic light emitting display device 100 may ensure an improved entire capacitance for all of the components thereof compared to that of the conventional organic light emitting display device without reducing the transmittance of the organic light emitting display device 100.

Referring to FIG. 2 again, the second gate electrode 146 may be disposed on the first gate electrode 142. Thus, the gate structure formed by the first and second gate electrodes 142, 146 of the semiconductor device may be provided over the substrate 110 in the pixel region II. The second gate electrode 146 may have an area substantially smaller than that of the first gate electrode 142. The second gate electrode 146 may include metal, alloy, metal nitride, etc. For example, the second gate electrode 146 may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, etc.

In example embodiments, the gate structure of the semiconductor device may partially or entirely serve as the second lower electrode of the second capacitor. In other words, the second capacitor may be disposed on the semiconductor device while the semiconductor device and the second capacitor share the gate structure as an electrode. Additionally, a wiring 143, which is adjacent to the first capacitor and the semiconductor device, may be disposed on the second gate insulation layer 135. The wiring 143 may have a multi-layered structure that includes a first wiring pattern and a second wiring pattern. In this case, the first and the second wirings may include materials substantially the same as those of the first and the second gate electrodes 142 and 146, respectively. Alternatively, the wiring 143 may include one wiring pattern. For example, the wiring 143 may include a scan line.

The first insulating interlayer 150 may be disposed on the second gate insulation layer 135 while covering the first upper electrode 141, the second gate electrode 146 and the wiring 143. That is, the first insulating interlayer 150 may be positioned in the transparent and the pixel regions I and II. For example, the first insulating interlayer 150 may include silicon nitride, silicon oxide, silicon oxynitride, etc. In the pixel region II, a portion of the first insulating interlayer 150 located on the gate structure may serve as the second dielectric structure of the second capacitor.

In the pixel region II, the second upper electrode 155 may be disposed on the first insulating interlayer 150. The second upper electrode 155 may be located on the second gate electrode 146 by interposing the first insulating interlayer 150 therebetween. Hence, the second capacitor including the second lower electrode, the second dielectric structure and the second upper electrode 155 may be provided on the semiconductor device. The second upper electrode 155 may include metal, alloy, metal nitride, etc. For example, the second upper electrode 155 may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, etc.

As described above, the first capacitor may be disposed in the transparent region I of the organic light emitting display device 100 while the second capacitor may be vertically arranged on the semiconductor device in the pixel region II of the organic light emitting display device 100. Therefore, the area of the pixel region II may be decreased without reducing the transmittance of the organic light emitting display device 100 while effectively providing a sufficient capacitance for the components of the organic light emitting display device 100.

As illustrated in FIG. 1, a first lower wiring 157 and a second lower wiring 159 may be provided in the pixel region II. The first lower wiring 157 may be electrically connected to the semiconductor device, and the second lower wiring 159 may be connected to the first lower wiring 157 through a contact. The first lower wiring 157 and the active pattern 125 may be positioned at the same level over the substrate 110. In addition, the second lower wiring 159 and the first lower electrode 126 may be positioned at the same level over the substrate 110. Therefore, a power voltage EVLDD may be applied to the first lower electrode 126 via the first lower wiring 157 and the second lower wiring 159.

The second insulating interlayer 160 may be disposed on the first insulating interlayer 150 to cover the second upper electrode 155. For example, the second insulating interlayer 160 may include silicon nitride, silicon oxide, silicon oxynitride, etc. The second insulating interlayer 160 may also be disposed in the transparent and the pixel regions I and II.

The third insulating interlayer 165 may be located on the second insulating interlayer 160. The third insulating interlayer 165 may also be disposed in the transparent and the pixel regions I and II. For example, the third insulating interlayer 165 may include silicon nitride, silicon oxide, silicon oxynitride, etc. Alternatively, the third insulating interlayer 165 may be omitted in accordance with the material and/or the dimension of the second insulating interlayer 160.

As illustrated in FIG. 1, the source electrode 137 and the drain electrode 138 may be disposed on the third insulating interlayer 165. For example, each of the source and the drain electrodes 137 and 138 may include metal, alloy, metal nitride, conductive metal oxide, etc. Further, the source electrode 137 and the drain electrode 138 may pass through via holes forming in the first to the third insulating interlayers 150, 160 and 165 and the first and the second gate insulation layers 130 and 135, so that the source electrode 137 and the drain electrode 138 may make contact with a source region and a drain region of the active pattern 125, respectively.

A first connection wiring 170 and a second connection wiring 172 may be disposed on the third insulating interlayer 165. The first and the second connection wirings 170 and 172 may be positioned at a level the same as that of the source and the drain electrodes 137 and 138. A first contact hole 167 and a second contact hole 169 may be provided through the first to the third insulating interlayers 150, 160 and 165. The first contact hole 167 and the second contact hole 169 may extend to and expose the second gate electrode 146 and the first upper electrode 141, respectively.

The first connection wiring 170 may extend on a sidewall of the first contact hole 167 provided through the first to the third insulating interlayers 150, 160 and 165, such that the first connection wiring 170 may make contact with the second gate electrode 146. Further, the first connection wiring 170 may extend into the transparent region I, and the first connection wiring 170 may contact the first upper electrode 141 via the second contact hole 169 provided through the first to the third insulating interlayers 150, 160 and 165. In other words, the first capacitor may be electrically connected to the semiconductor device via the first connection wiring 170.

The second connection wiring 172 adjacent to the first connection wiring 170 may be located on the third insulating interlayer 165. The second connection wiring 172 may electrically connect the second upper electrode 155 of the second capacitor to the first lower electrode 126 of the first capacitor. For example, a first additional contact hole (not illustrated) may be provided through the second the third insulating interlayers 160 and 165 to expose a portion of the second upper electrode 155. Further, a second additional contact hole (not illustrated) exposing the first lower electrode 126 may be provided through the first to the third insulating interlayers 155, 160 and 165 and the first and the second gate insulation layers 130 and 135. The second connection wiring 172 may make contact with the second upper electrode 155 and the first lower electrode 126 through the first and the second additional contact holes. Therefore, the first capacitor may be electrically connected to the second capacitor via the second connection wiring 172. For example, the first and the second connection wirings 170 and 172 may include materials substantially the same as those of the source and the drain electrodes 137 and 138.

Referring to FIGS. 1 and 2 again, an insulation layer 175 may be disposed on the third insulating interlayer 165. The insulation layer 175 may substantially cover the first connection wiring 170, the second connection wiring 172, the source electrode 137 and the drain electrode 138. The insulation layer 175 may include an organic material. For example, the insulation layer 175 may include polyimide-based resin, photoresist, acryl-based resin, polyamide-based resin, siloxane-based resin, etc. Alternatively, the insulation layer 175 may include an inorganic material such as silicon compound, metal oxide, etc.

In the pixel region II, the first electrode 180 may be disposed on the insulation layer 175. The first electrode 180 may include metal, alloy, metal nitride, etc. For example, the first electrode 180 may include aluminum, an alloy containing aluminum, silver, an alloy containing silver, tungsten, tungsten nitride, copper, an alloy containing copper, nickel, chromium, chromium nitride, molybdenum, an alloy containing molybdenum, titanium, titanium nitride, tantalum, tantalum nitride, etc.

A pixel defining layer 185 may be disposed on the insulation layer 175. The pixel defining layer 185 may have an opening that partially exposes the first electrode 180. The luminescent region of the organic light emitting display device 100 may be defined by the pixel defining layer 185 having such opening. The pixel defining layer 185 may include an organic material. For example, the pixel defining layer 185 may include polyimide-based resin, photoresist, polyacryl-based resin, polyamide-based resin, acryl-based resin, etc.

An organic light emitting layer 190 may be disposed on a portion of the first electrode 180 exposed by the opening of the pixel defining layer 185. The organic light emitting layer 190 may include different light emitting materials such as a material generating a red color of light, a material generating a greed color of light or a material generating a blue color of light in accordance with the pixels of the organic light emitting display device 100. Alternatively, the organic light emitting layer 190 may include a stack of these materials for generating a white color of light.

The second electrode 195 may be disposed on the organic light emitting layer 190 and the pixel defining layer 185. The second electrode 195 may include metal, alloy, metal nitride, etc. For example, the second electrode 195 may include aluminum, an alloy containing aluminum, silver, an alloy containing silver, tungsten, tungsten nitride, copper, an alloy containing copper, nickel, chromium, chromium nitride, molybdenum, an alloy containing molybdenum, titanium, titanium nitride, tantalum, tantalum nitride, etc. Thus, the organic light emitting structure including the first electrode 180, the organic light emitting layer 190 and the second electrode 195 may be provided in the pixel region II. Although it is not illustrated, an additional substrate such as a transparent substrate, an encapsulation substrate or a window may be disposed on the second electrode 195.

As for the conventional transparent organic light emitting display device, the semiconductor device and the capacitor are disposed in the pixel region II only, so that the capacitance of the capacitor may not properly increased because of the limited area of the pixel region II. According to example embodiments, the organic light emitting display device 100 may include the main capacitor positioned in the pixel region II and the auxiliary capacitor located in the transparent region I. Therefore, the organic light emitting display device 100 may ensure the sufficient capacitance of the capacitors for the components thereof without increasing the area of the pixel region II while maintaining the transmittance of the organic light emitting display device 100.

FIGS. 3 to 9 are cross sectional views illustrating a method of manufacturing an organic light emitting display device in accordance with example embodiments. In FIGS. 3 to 9, like elements are denoted by like reference numerals as FIGS. 1 and 2.

Figure 3:
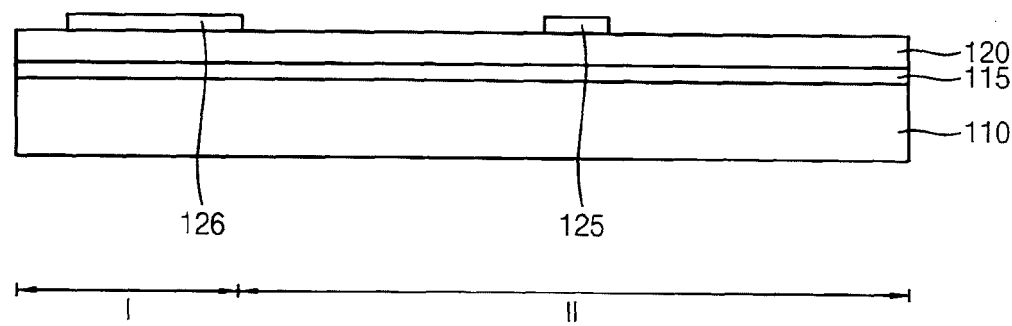
FIGS. 3, 4, 5, 6, 7, 8 and 9 are cross sectional views illustrating a method of manufacturing an organic light emitting display device in accordance with example embodiments.

Referring to FIG. 3, a first buffer layer 115 and a second buffer layer 120 may be formed on a substrate 110. The substrate 110 may have a pixel region II and a transparent region I. Images may be displayed in the pixel region II and images of objects may be transmitted through the transparent region I. For example, the substrate 110 may be formed using a transparent insulation material.

The first and the second buffer layers 115 and 120 may improve a flatness of the substrate 110 and also prevent diffusion of impurities from the substrate 110. For example, each of the first and the second buffer layers 115 and 120 may be formed using silicon nitride, silicon oxynitride, silicon oxide, etc. The first and the second buffer layers 115 and 120 may be formed using the same material. Alternatively, the first and the second buffer layers 115 and 120 may be formed using different materials.

An active pattern 125 of a semiconductor device and a first lower electrode 126 of a first capacitor may be formed on the second buffer layer 120. In example embodiments, a material layer (not illustrated) containing silicon may be formed on the second buffer layer 120, and then the material layer may be patterned to form the active pattern 125 in the pixel region II and to form the first lower electrode 126 in the transparent region I. For example, the material layer may include polysilicon. The first lower electrode 126 may have an area substantially greater than an area of the active pattern 125. The material layer containing silicon may be formed on the second buffer layer 120 by a chemical vapor deposition process, plasma enhanced chemical vapor deposition process, low pressure chemical vapor deposition process, high density plasma chemical vapor deposition process, etc.

Figure 4:
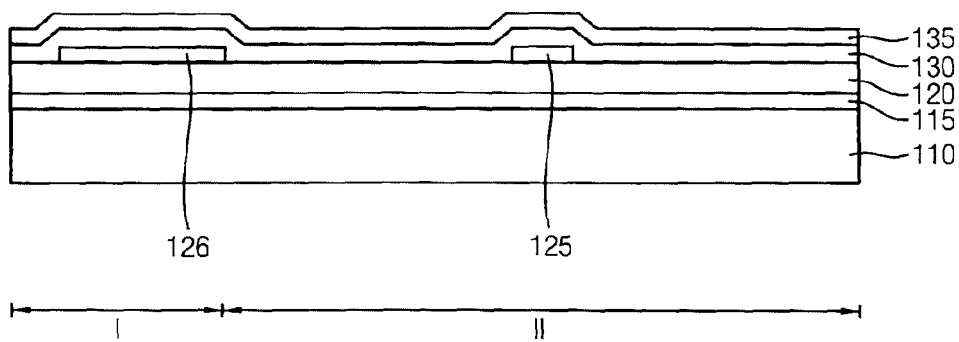

Referring to FIG. 4, a first gate insulation layer 130 may be formed on the second buffer layer 120 to cover the active pattern 125 and the first lower electrode 126. The first gate insulation layer 130 may be formed using silicon compound or metal oxide. The first gate insulation layer 130 may be conformally formed on the second buffer layer 120 along profiles of the active pattern 125 and the first lower electrode 126.

A second gate insulation layer 135 may be formed on the first gate insulation layer 130. The second gate insulation layer 135 may be formed using silicon compound or metal oxide. The first and the second gate insulation layers 130 and 135 may be formed using different materials, respectively. Alternatively, the first and the second gate insulation layers 130 and 135 may be formed using the same material. Further, the second gate insulation layer 135 may be conformally formed along a profile of the first gate insulation layer 130.

Figure 5:
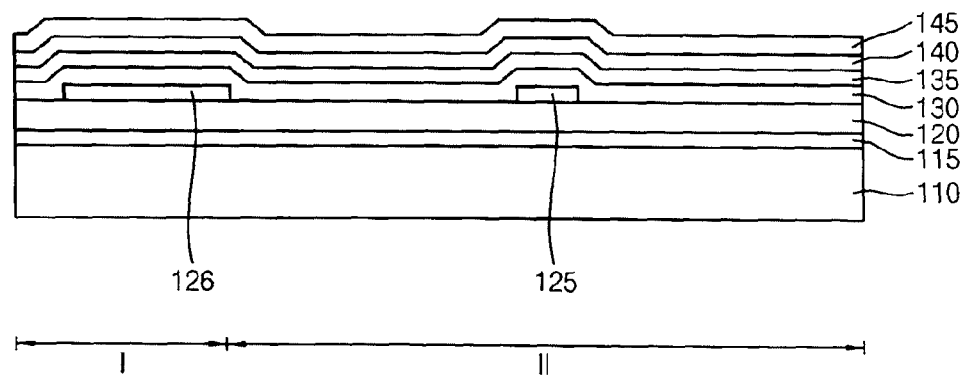

Referring to FIG. 5, a first electrode layer 140 may be formed on the second gate insulation layer 135. In example embodiments, the first electrode layer 140 may be formed using a material having a transmittance. For example, the first electrode layer 140 may be formed using a transparent conductive material such as indium tin oxide, indium zinc oxide, zinc oxide, tin oxide, gallium oxide, indium oxide, etc. The first electrode layer 140 may be formed in the transparent and the pixel regions I and II of the substrate 110.

A second electrode layer 145 may be formed on the first electrode layer 140. The second electrode layer 145 may be formed using metal, alloy, metal nitride, etc. For example, the second electrode layer 145 may be formed using aluminum, an alloy containing aluminum, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, etc. Alternatively, the second electrode layer 145 may be formed using a material the same as a material of the first electrode layer 140.

Figure 6:
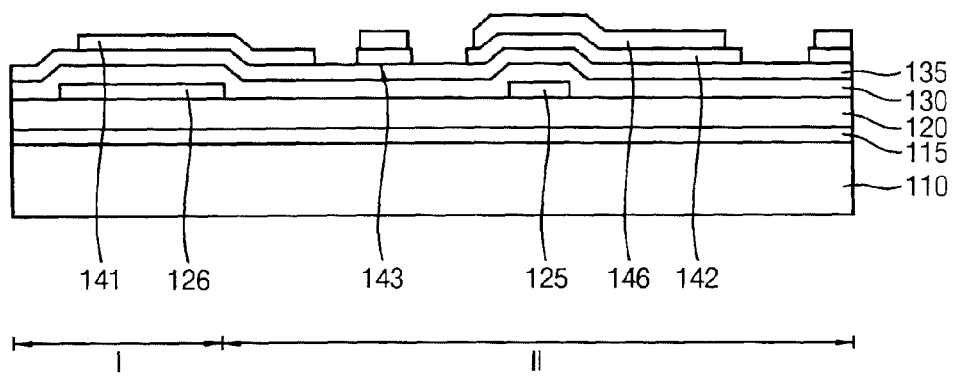

Referring to FIG. 6, after an etching mask (not illustrated) may be provided on the second electrode layer 145, the second electrode layer 145 may be patterned using the etching to thereby form a first upper electrode 141 of the first capacitor, a gate structure of the semiconductor device and a wiring 143 on the second gate insulation layer 135.

According to example embodiments, the first upper electrode 141 may be positioned on the first lower electrode 126 by interposing portions of the first and the second gate insulation layers 130 and 135 therebetween. In other words, the portions the first and the second gate insulation layers 130 and 135 may serve as a first dielectric structure of the first capacitor in the transparent region I. Thus, the first capacitor including the first lower electrode 126, the first dielectric structure and the first upper electrode 141 may be formed on the substrate 110 in the transparent region I. Here, the first upper electrode 141 may have an area substantially greater than that of the first lower electrode 126. In the pixel region II, the gate structure of the semiconductor device may include a first gate electrode 142 and a second gate electrode 146. The first gate electrode 142 may be located on the active pattern 125 by interposing portions of the first and the second gate insulation layers 130 and 135 therebetween. The wiring 143 may be adjacent to the first capacitor and the semiconductor device. For example, the wiring 143 may include scan lines.

In example embodiments, the first upper electrode 141, the wiring 143, the first gate electrode 142 and the second gate electrode 146 may be formed by an etching process using an etching mask such as a halftone mask or a halftone slit mask. For example, a photoresist film (not illustrated) may be formed on the second electrode layer 145, and then the photoresist film may be selectively exposed using the etching mask and developed, so that the etching mask may be provided on the second electrode layer 145. Here, a first portion of the etching mask in the transparent region I may have a thickness substantially larger than a thickness of a second portion of the etching mask in the pixel region II. In case that the etching process is performed about the second electrode layer 145 and the first electrode layer 140 using the etching mask such as the halftone mask or the halftone slit mask, the first upper electrode 141, the wiring 143, the first gate electrode 142 and the second gate electrode 146 may be obtained in the transparent and the pixel regions I and II, respectively. In other words, the first upper electrode 141 of the first capacitor, the wiring 143 and the gate structure of the semiconductor device may be formed by one etching process, so that an additional etching process for forming the first capacitor in the transparent region I may not be required.

According to example embodiments, impurities may be implanted into the first lower electrode 126 using the first upper electrode 141 as a mask. For example, p+ type impurities such as boron (B), gallium (Ga) or indium (In) may be implanted into the first lower electrode 126. In some example embodiments, the impurities may be implanted into the first lower electrode 126 while doping impurities into the active pattern 125 using the gate structure as a mask to form a source region and a drain region.

Figure 7:
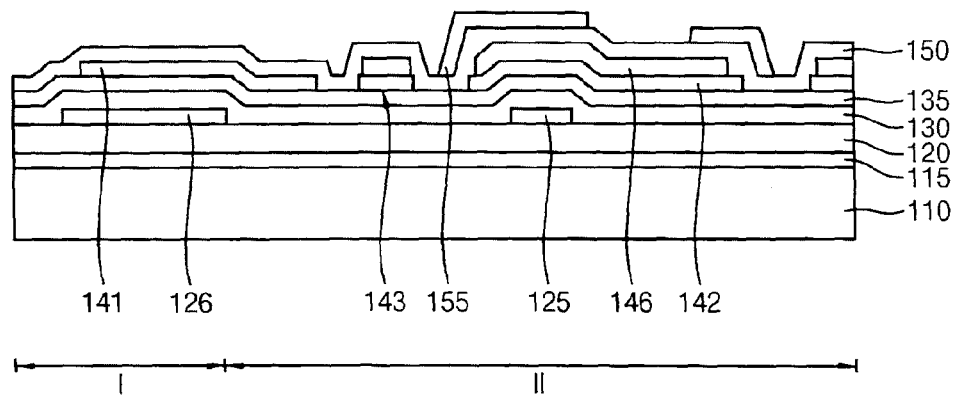

Referring to FIG. 7, a first insulating interlayer 150 may be formed on the second gate insulation layer 135 to cover the first upper electrode 141, the second gate electrode 146 and the wiring 143. For example, the first insulating interlayer 150 may be formed using silicon compound, metal nitride, etc. The first insulating interlayer 150 may be formed in the pixel region II and the transparent region I.

After a second electrode layer (not illustrated) may be formed on the first insulating interlayer 150, the second electrode layer may be patterned to form a second upper electrode 155 of a second capacitor on the second gate electrode 146. The second electrode layer may be formed using metal, alloy, metal nitride, conductive metal oxide, transparent conductive material, etc. For example, the second electrode layer may be formed using aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, zinc oxide, indium tin oxide, tin oxide, indium oxide, gallium oxide, indium zinc oxide, etc.

In example embodiments, the second capacitor in the pixel region II may include a second lower electrode, a second dielectric structure and the second upper electrode 155. The second lower electrode of the second capacitor may be the gate structure of the semiconductor device, and the second dielectric structure may include a portion of the first insulating interlayer 150 positioned in the pixel region II and between the second lower electrode formed by the first and second gate electrodes 142, 146 and the second upper electrode 155. That is, the second capacitor may be formed on the semiconductor device while the second capacitor and the semiconductor device may share the gate structure as an electrode.

Although it is not illustrated in FIG. 7, a second lower wiring contacting a first lower wiring may be formed at a level the same as that of the active pattern 125 as described with reference to FIG. 1. Here, the first lower wiring may be electrically connected to the semiconductor device. Accordingly, a power voltage EVLDD may be applied to the first lower electrode 126 via the first and the second lower wirings.

Figure 8:
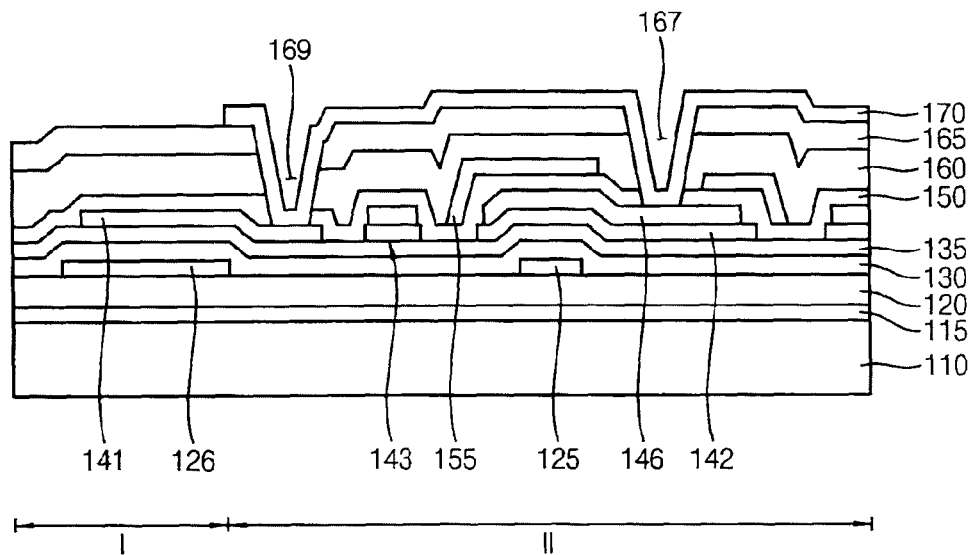

Referring to FIG. 8, a second insulating interlayer 160 may be formed on the first insulating interlayer 150 to cover the second upper electrode 155. For example, the second insulating interlayer 160 may be formed using silicon compound or metal nitride. The second insulating interlayer 160 may be formed using a material substantially the same as or different from that of the first insulating interlayer 150. The second insulating interlayer 160 may be formed in the transparent and the pixel regions I and II.

A third insulating interlayer 165 may be formed on the second insulating interlayer 160. For example, the third insulating interlayer 165 may be formed using silicon compound or metal nitride. The third insulating interlayer 165 may be formed using a material substantially the same as or different from that of the second insulating interlayer 160 and/or that of the first insulating interlayer 150. The third insulating interlayer 165 may also be formed in the transparent and the pixel regions I and II.

A first connection wiring 170 may be formed on the third insulating interlayer 165. In example embodiments, a first contact hole 167 and a second contact hole 169 may be formed by partially removing the third insulating interlayer 165, the second insulating interlayer 160 and the first insulating interlayer 150. The first contact hole 167 and the second contact hole 169 may extend to and expose the second gate electrode 146 of the semiconductor device and the first upper electrode 141 of the first capacitor, respectively. A conductive layer (not illustrated) may be formed on the third insulating interlayer 165 to fill the first and the second contact holes 167, 169, and then the conductive layer may be patterned to form the first connection wiring 170 which may be electrically connected to the first upper electrode 141 and the second gate electrode 146. Therefore, the semiconductor device in the pixel region II may be electrically connected to the first capacitor in the transparent region I via the first connection wiring 170. For example, the conductive layer may be formed using a transparent conductive material, metal, alloy, metal nitride, conductive metal oxide, etc.

Although it is not illustrated in FIG. 8, a source electrode and a drain electrode may be formed on the third insulating interlayer 165 in the pixel region II as described with reference to FIG. 1. For example, each of the source and the drain electrodes may be formed using metal, alloy or metal nitride. The source and the drain electrodes may make contact with the source and the drain regions of the active pattern 125, respectively. Further, a second connection wiring adjacent to the first connection wiring 170 may be formed at a level the same as that of the source and the drain electrodes. The second connection wiring contacting the second upper electrode 155 may extend into an additional contact hole extending to and exposing the first lower electrode 126, so that the second connection wiring may electrically connect the second upper electrode 155 of the second capacitor to the first lower electrode 126 of the first capacitor.

Figure 9:
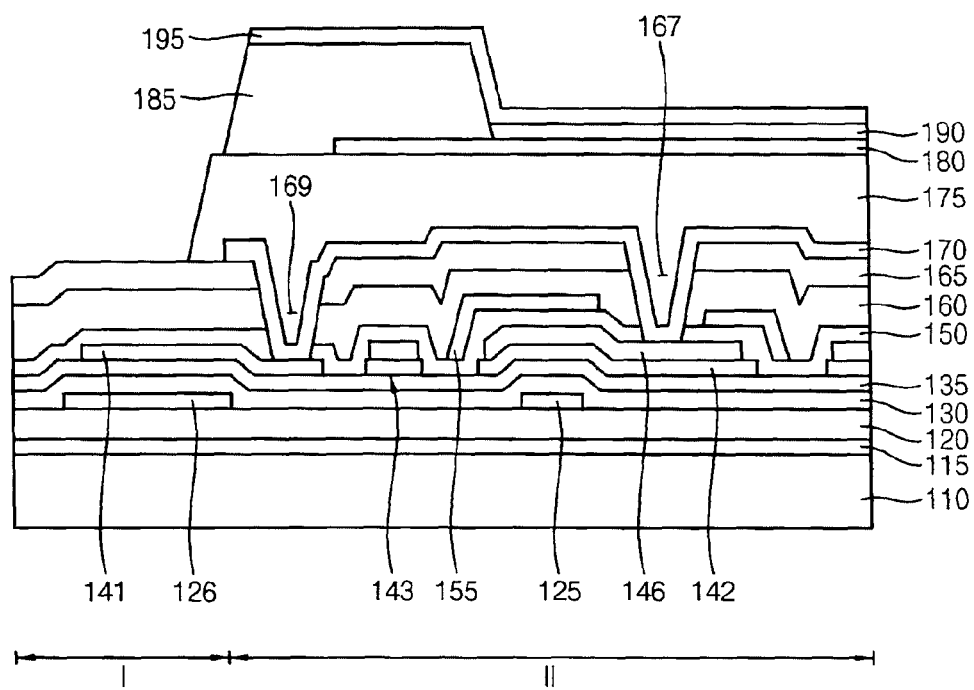

Referring to FIG. 9, an insulation layer 175 may be formed on the third insulating interlayer 165 to cover the first connection wiring 170. The insulation layer 175 may be formed using an organic material. For example, the insulation layer 175 may be formed using photoresist, acryl-based resin, polyimide-based resin, polyamide-based resin, siloxane-based resin, etc. In example embodiments, the insulation layer 175 may be formed in the pixel region II only. For example, the insulation layer 175 may be formed onto a boundary between the pixel region II and the transparent region I.

In the pixel region II, a first electrode 180 may be formed on the insulation layer 175. The first electrode 180 may be formed using metal, alloy, metal nitride, conductive metal oxide, etc. A contact hole (not illustrated) exposing the drain electrode of the semiconductor device may be formed through the insulation layer 175, and then the first electrode 180 may be formed on the exposed drain electrode, a sidewall of the contact hole and the insulation layer 175.

A pixel defining layer 185 may be formed on the insulation layer 175 to cover the first electrode 180. The pixel defining layer 185 may be partially removed to form an opening exposing a portion of the first electrode 180. The pixel defining layer 185 may be formed using an organic material or an inorganic material. For example, the pixel defining layer 185 may be formed from the pixel region II to the boundary between the pixel region II and the transparent region I.

Referring to FIG. 9 again, an organic light emitting layer 190 may be formed on a portion of the first electrode 180 exposed by the opening of the pixel defining layer 185. For example, the organic light emitting layer 190 may be obtained by sequentially stacking an organic light emitting layer (EL), a hole injection layer (HIL), a hole transfer layer (HTL), an electron transfer layer (ETL) and an electron injection layer (ELL) on the exposed portion of the first electrode 180.

A second electrode 195 may be formed on the pixel defining layer 185 and the organic light emitting layer 190. The second electrode 195 may be formed using metal, alloy, metal nitride, conductive metal oxide, etc. As the formation of the second electrode 195, an organic light emitting structure including the first electrode 180, the organic light emitting layer 190 and the second electrode 195 may be formed in the pixel region II. An additional substrate such as a transparent substrate, a window or an encapsulation substrate may be formed on the second electrode 190.

Figure 10:
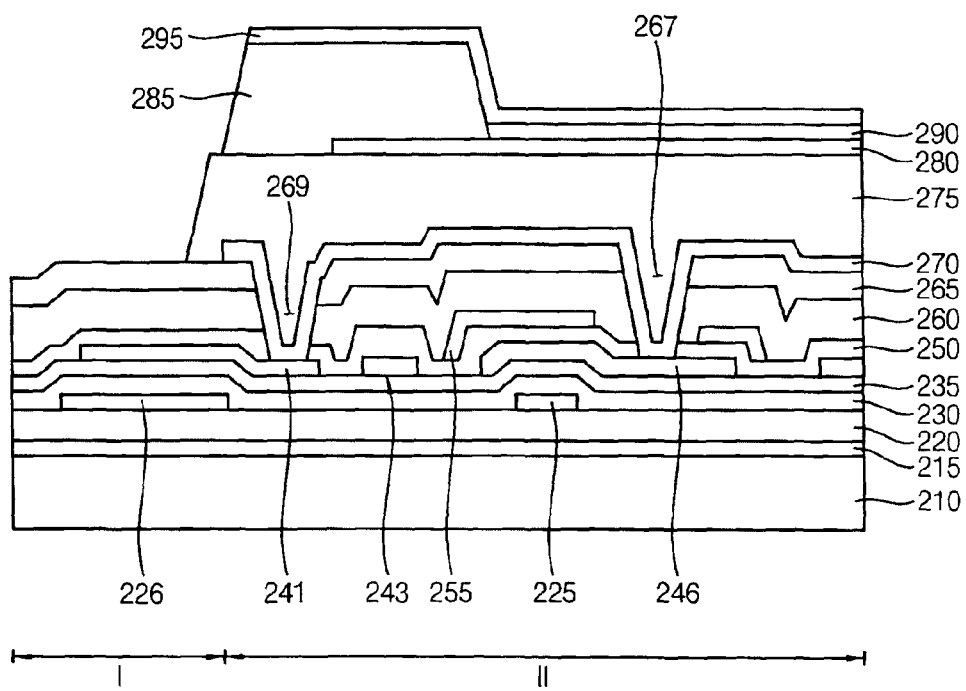
FIG. 10 is a cross sectional view illustrating an organic light emitting display device in accordance with some example embodiments.

FIG. 10 is a cross sectional view illustrating an organic light emitting display device in accordance with some example embodiments. It will be omitted the descriptions of elements substantially the same as those described with reference to FIGS. 1 and 2.

Referring to FIG. 10, an organic light emitting display device 200 may include a semiconductor device provided on a substrate 210 having a first buffer layer 215 and a second buffer layer 220, a first capacitor, a second capacitor, an organic light emitting structure, etc.

The semiconductor device may be located in a pixel region II of the organic light emitting display device 200, and may include an active pattern 225, a first gate insulation layer 230, a second gate insulation layer 235, a gate electrode 246, a source electrode (not illustrated) and a drain electrode (not illustrated). In a transparent region I of the organic light emitting display device 200, the first capacitor may include a first lower electrode 226, a first dielectric structure and a first upper electrode 241. For example, the first lower electrode 226 may include polysilicon doped with impurities. The first dielectric structure may include portions of the first and the second gate insulation layers 230 and 235 positioned in the transparent region I. In the pixel region II, the second capacitor may include a second lower electrode, a second dielectric structure and a second upper electrode 255. The organic light emitting structure may include a first electrode 280, an organic light emitting layer 290 and a second electrode 295. The second lower electrode of the second capacitor may be the gate electrode 246 of the semiconductor device, and the second dielectric structure may include a portion of a first insulating interlayer 250 located in the pixel region II.

As illustrated in FIG. 10, the first upper electrode 241 and the gate electrode 246 may be disposed on the first and the second gate insulation layers 230 and 235 under which the first lower electrode 226 and the active pattern 225 are positioned. The first upper electrode 241 may include a transparent conductive material, and the gate electrode 246 may include metal, alloy, metal nitride, conductive metal oxide, etc. Alternatively, the gate electrode 246 may also include a transparent conductive material. A wiring 243 adjacent to the gate electrode 246 may be disposed on the second gate insulation layer 235. For example, the wiring 243 may include a material substantially the same as that of the gate electrode 246. The semiconductor device illustrated in FIG. 10 may include a gate structure composed of the gate electrode 246, so that the semiconductor device may have a configuration simpler than that of the semiconductor device described with reference to FIG. 2.

The first insulating interlayer 250 may cover the first upper electrode 241, the wiring 243 and the gate electrode 246. The first insulating interlayer 250 may be positioned on the second gate insulation layer 235. The second upper electrode 255 may be located on a portion of the first insulating interlayer 250 where the gate electrode 246 is positioned. A second insulating interlayer 260 and a third insulating interlayer 265 may be sequentially disposed on the first insulating interlayer 250 and the second upper electrode 255.

A first connection wiring 270 may make contact with the first upper electrode 241 and the gate electrode 246 via a first contact hole 267 and a second contact hole 269 formed through the first to the third insulating interlayers 250, 260 and 265. An insulation layer 275 may be disposed on the third insulating interlayer 265 and the first connection wiring 270.

In the pixel region II, the first electrode 280 may be disposed on the insulation layer 275, and a pixel defining layer 285 may be positioned on the insulation layer 275 and the first electrode 280. The pixel defining layer 285 may have an opening that partially exposes the first electrode 280. The organic light emitting layer 290 may be disposed on the exposed first electrode 280, and the second electrode 295 may be located on the pixel defining layer 285 and the organic light emitting layer 290. A transparent substrate, a window and/or an encapsulation substrate may be selectively disposed on the second electrode 295.

FIGS. 11 to 15 are cross sectional views illustrating a method of manufacturing an organic light emitting display device in accordance with some example embodiments. The method illustrated in FIGS. 11 to 15 may provide an organic light emitting display device having a configuration substantially the same as or similar to that of the organic light emitting display device 200 in FIG. 10.

Figure 11:
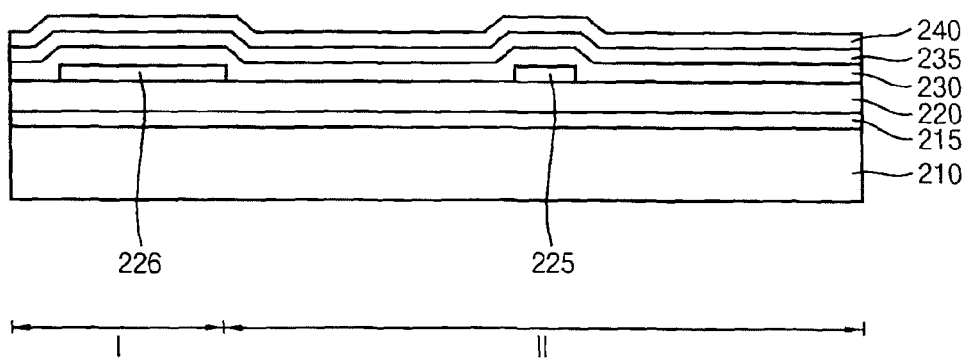
FIGS. 11, 12, 13, 14 and 15 are cross sectional views illustrating a method of manufacturing an organic light emitting display device in accordance with some example embodiments.

Referring to FIG. 11, a first buffer layer 215 and a second buffer layer 220 may be formed on a substrate 210, and then an active pattern 225 and a first lower electrode 226 may be formed on the second buffer layer 220. The first lower electrode 226 and the active pattern 225 may be positioned in a transparent region I and a pixel region II of an organic light emitting display device.

A first gate insulation layer 230 and a second gate insulation layer 235 may be successively formed on the second buffer layer 220, the active pattern 225 and the first lower electrode 226. For example, each of the first and the second gate insulation layers 230 and 235 may be formed using the same material or the first and the second gate insulation layers 230 and 235 may be formed using different materials, respectively. Alternatively, only one of the first and the second gate insulation layers 230 and 235 may be formed on the second buffer layer 220.

A first electrode layer 240 may be formed on the second gate insulation layer 235. In example embodiments, the first electrode layer 240 may be formed using a material having a transmittance such as an indium tin oxide, indium zinc oxide, zinc oxide, tin oxide, gallium oxide, indium oxide, etc.

Figure 12:
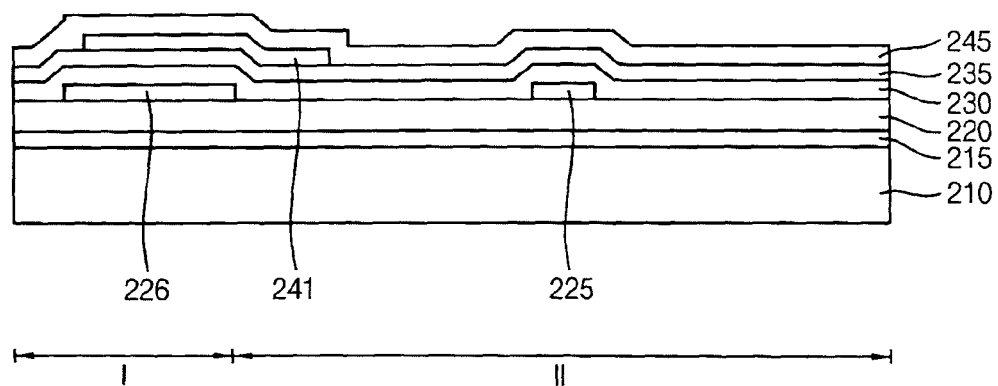

Referring to FIG. 12, the first electrode layer 240 may be patterned to form a first upper electrode 241 on a portion of the second gate insulation layer 235 in the transparent region I. The first upper electrode 241 may be located on the first lower electrode 226 by interposing the first and the second gate insulation layers 230 and 235 therebetween. Accordingly, a first capacitor including the first lower electrode 226, a first dielectric structure (i.e., portions of the first and the second gate insulation layers 230 and 235 in the transparent region I) and the first upper electrode 241 may be provided in the transparent region I of the organic light emitting display device.

A second electrode layer 245 may be formed on the first upper electrode 241 and the second gate insulation layer 235. For example, the second electrode layer 245 may be formed using metal, alloy, metal nitride, etc. Alternatively, the second electrode layer 245 may be formed using a material substantially the same as that of the first electrode layer 240.

Figure 13:
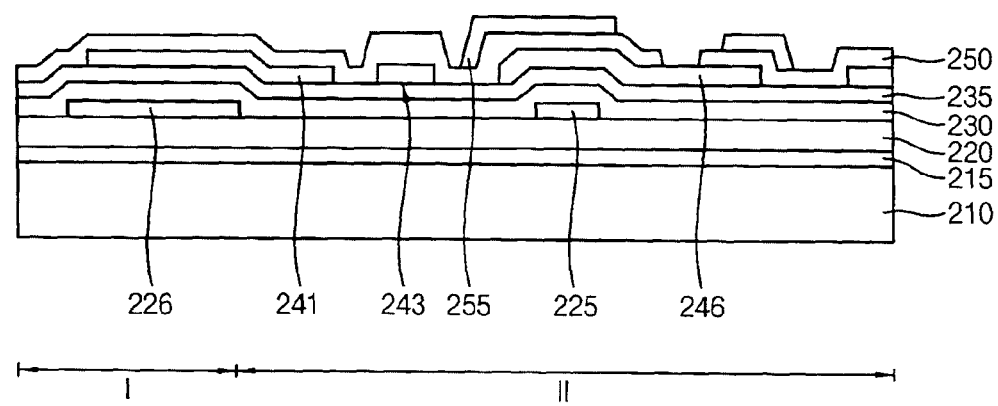

Referring to FIG. 13, the second electrode layer 245 may be patterned to form a gate electrode 246 and a wiring 243 in the pixel region II. The gate electrode 246 may be formed on the active pattern 225 by interposing the first and the second gate insulation layers 230 and 235 therebetween. The wiring 243 may be formed on the second gate insulation layer 235. The wiring 243 may adjacent to the first upper electrode 241 and the gate electrode 246. In some example embodiments, the first upper electrode 241 and the gate electrode 246 may be obtained a relatively simple etching process without a halftone mask or a halftone slit mask. The semiconductor device may include the gate electrode 246 having a simple configuration obtained by simplified processes, such that the organic light emitting display device may also have a simple configuration while ensuring a sufficient capacitance for components thereof.

A first insulating interlayer 250 may be formed on the first upper electrode 241, the wiring 243, the gate electrode 246 and the second gate insulation layer 235. For example, the first insulating interlayer 250 may be formed using silicon compound. The first insulating interlayer 250 may be conformally formed on the second gate insulation layer 235 along profiles of the first upper electrode 241, the wiring 243 and the gate electrode 246.

After forming a conductive layer (not illustrated) on the first insulating interlayer 250, the conductive layer may be patterned to form a second upper electrode 255 on a portion of the first insulating interlayer 250 under which the gate electrode 246 is located. For example, the conductive layer may be formed using metal, alloy, metal nitride, etc. Thus, a second capacitor including a second lower electrode (i.e., the gate electrode 246), a second dielectric structure (i.e., a portion of the first insulating interlayer 250 in the pixel region II) and the second upper electrode 255 may be provided in the pixel region II.

Figure 14:
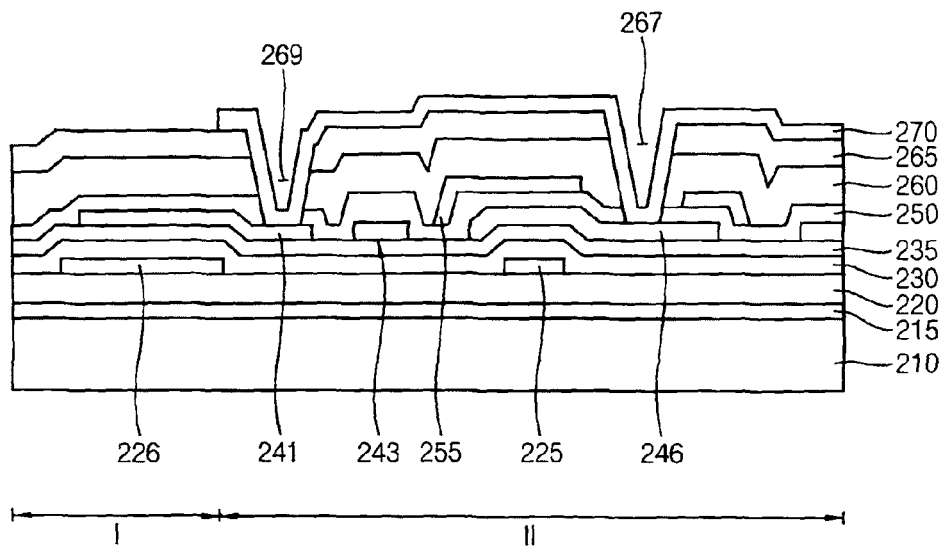

Referring to FIG. 14, a second insulating interlayer 260 and a third insulating interlayer 265 may be additionally formed on the second upper electrode 255 and the first insulating interlayer 250. Alternatively, one of the second insulating interlayer 260 and the third insulating interlayer 265 may be formed on the first insulating interlayer 250 to cover the second upper electrode 255. For example, the second and the third insulating interlayers 260 and 265 may be formed using different materials, or each of the second and the third insulating interlayers 260 and 265 may be formed using the same material.

Although it is not illustrated in FIG. 14, a source electrode and a drain electrode may be formed on the third insulating interlayer 265. The source electrode and the drain electrode may pass through the third to the first insulating interlayers 265, 260 and 250 and the second and the first gate insulation layers 235 and 230, and then make contact with a source region and a drain region of the active pattern 225, respectively.

A first connection wiring 270 may be formed on the third insulating interlayer 265. The first connection wiring 270 may contact the gate electrode 246 and the first upper electrode 241 via the first and the second contact holes 267 and 269 formed through the first to the third insulating interlayers 250, 260 and 265. Hence, the semiconductor device may be electrically connected to the first capacitor via the first connection wiring 270. Although it is not illustrated, a second connection wiring adjacent to the first connection wiring 270 may be formed on the third insulating interlayer 265. The second connection wiring may make contact with the second upper electrode 255 and the first lower electrode 226 through additional contact holes, so that the second capacitor may be electrically connected to the first capacitor.

Figure 15:
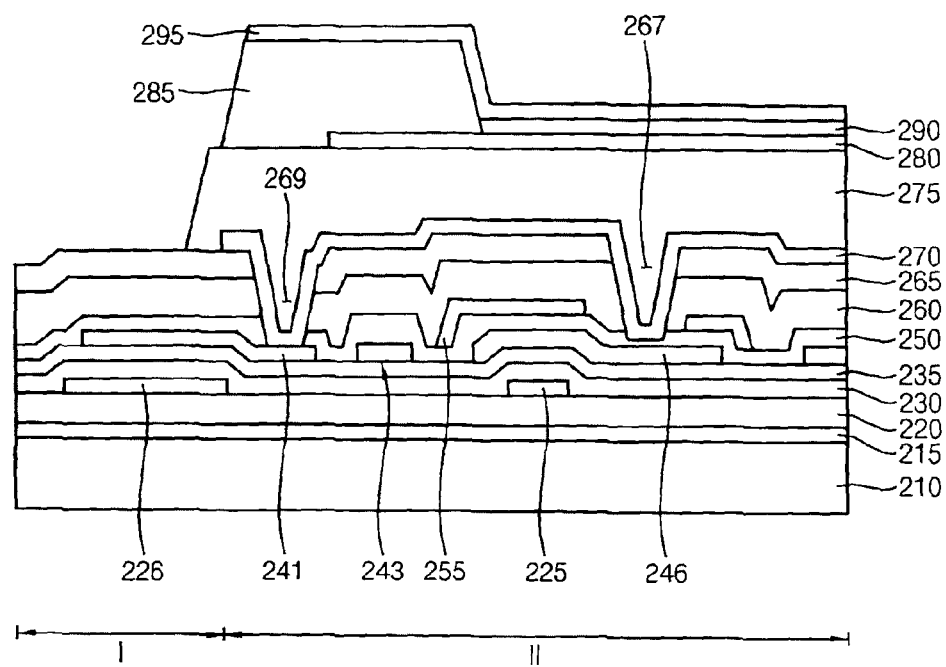

Referring to FIG. 15, an insulation layer 275 may be formed on the first connection wiring 270 and the third insulating interlayer 265, and a first electrode 280 may be formed on the insulation layer 275. Here, the insulation layer 275 may have a substantially flat upper face. A pixel defining layer 285 may be formed on the first electrode 280 and the insulation layer 275. The pixel defining layer 285 may be partially removed to form an opening that exposes a portion of the first electrode 280. An organic light emitting layer 290 may be formed on the exposed portion of the first electrode 280, and then a second electrode 295 may be formed on the organic light emitting layer 290 and the pixel defining layer 285. Hence, an organic light emitting structure including the first electrode 280, the organic light emitting layer 290 and the second electrode 295 may be provided in the pixel region II. A transparent substrate, a window and/or an encapsulation substrate may be additionally formed on the second electrode 295.

Figure 16:
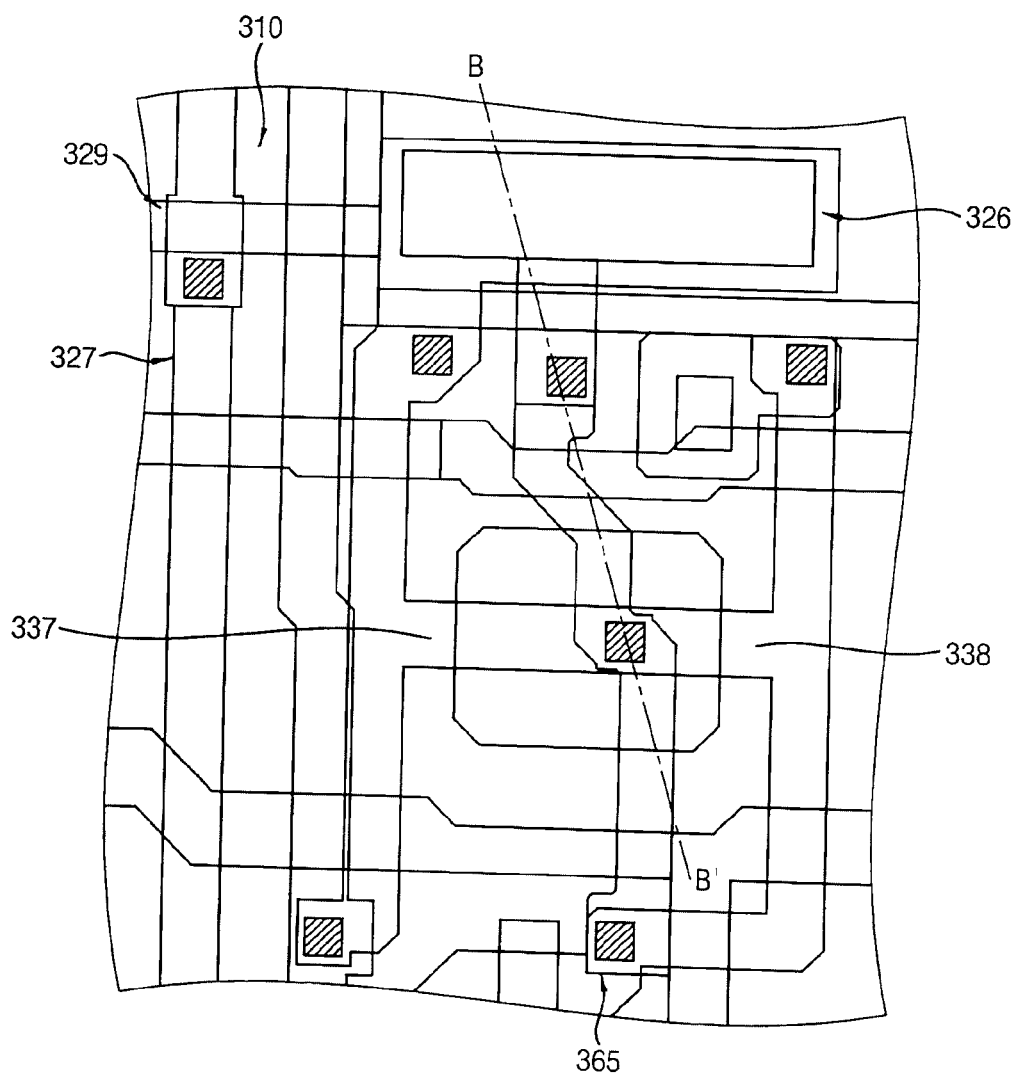
FIG. 16 is a plan view illustrating an organic light emitting display device in accordance with some example embodiments.
Figure 17:
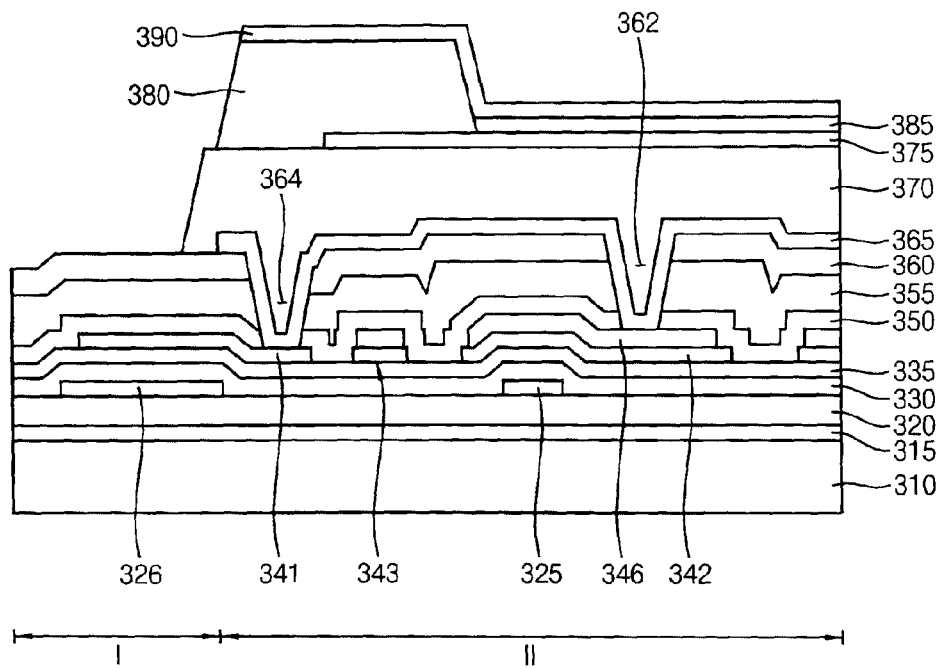
FIG. 17 is a cross sectional view illustrating the organic light emitting display device taken along a line of B-B' in FIG. 16.

FIG. 16 is a plan view illustrating an organic light emitting display device 300 in accordance with some example embodiments. FIG. 17 is a cross sectional view illustrating the organic light emitting display device 300 taken along a line of B-B' in FIG. 16. In the organic light emitting display device 300 illustrated in FIGS. 16 and 17, it will be omitted detailed description for elements substantially the same as those described with reference to FIGS. 1 and 2. Referring to FIGS. 16 and 17, the organic light emitting display device 300 may include a substrate having a pixel region II and a transparent region I, a semiconductor device, a capacitor, an organic light emitting structure, etc.

The semiconductor device and the organic light emitting structure may be located in the pixel region II and the capacitor may be positioned in the transparent region I. That is, the organic light emitting display device 300 may include the capacitor disposed in the transparent region I without a capacitor in the pixel region II. Thus, the organic light emitting display device 300 may have a simple configuration while ensuring a capacitance for components including the semiconductor device and the organic light emitting structure.

The semiconductor device may include, an active pattern 325, a first gate insulation layer 330, a second gate insulation layer 335, a gate structure having a first gate electrode 342 and a second gate electrode 346, a source electrode 337 and a drain electrode 338. The organic light emitting structure may be electrically connected to the semiconductor device. The organic light emitting structure may include a first electrode 375, an organic light emitting layer 385 and a second electrode 390. Additionally, the capacitor electrically contacting the semiconductor device may include a lower electrode 326, a dielectric structure and an upper electrode 341. Here, the dielectric structure may include portions of the first and the second gate insulation layers 330 and 335 positioned in the transparent region I.

A first buffer layer 315 and a second buffer layer 320 may be successively disposed on the substrate 310. The semiconductor device and the capacitor may be provided on the second buffer layer 320. The first and the second gate insulation layers 330 and 335 may be sequentially formed on the second buffer layer 320, the active pattern 325 and the lower electrode 326. As illustrated in FIG. 16, a first lower wiring 329 may be electrically connected to the semiconductor, and a second lower wiring 327 may be connected to the first lower wiring 329 through a contact. The second lower wiring 327 and the active pattern 325 may be positioned at the same level over the substrate 310. Hence, a power voltage ELVDD applied to the first lower wiring 329 may be transmitted to the active pattern 325 and the lower electrode 326 via the second lower wiring 327.

The upper electrode 341, a wiring 343 and the first gate electrode 342 may be disposed on the second gate insulation layer 335, and the second gate electrode 346 may be located on the first gate electrode 342. Thus, the capacitor including the lower electrode 326, the dielectric structure (i.e., the portions of the first and the second gate insulation layers 330 and 335 in the transparent region I) and the upper electrode 341 may be provided in the transparent region I. For example, the lower electrode 326 may include polysilicon doped with impurities and the upper electrode 341 may include a transparent conductive material.

A first insulating interlayer 350 may be disposed on the second gate insulation layer 335 to cover the upper electrode 341, the wiring 343 and the second gate electrode 346. A second insulating interlayer 355 and a third insulating interlayer 360 may be sequentially disposed on the first insulating interlayer 350. Alternatively, one or two of the first to the third insulating interlayers 350, 355 and 360 may be omitted in accordance with materials and/or dimensions thereof. A first contact hole 362 and, a second contact hole 364 may be provided through the first to the third insulating interlayers 350, 355 and 360. The first contact hole 362 and the second contact hole 364 may extend to and expose the second gate electrode 346 and the upper electrode 341, respectively.

A connection wiring 365 may be disposed on the third insulating interlayer 360, and may be electrically connected to the second gate electrode 346 and the upper electrode 341 through the first and the second contact holes 362 and 364. Thus, the semiconductor device may be electrically connected to the capacitor. An insulation layer 370 may be located on the third insulating interlayer 360 to cover the connection wiring 365. The first electrode 375 may be disposed on a portion of the insulation layer 370 in the pixel region II.

A pixel defining layer 380 may be disposed on the first electrode 375 and the insulation layer 370. The pixel defining layer 380 may have an opening that partially exposes the first electrode 375. The organic light emitting layer 385 may be positioned on the exposed first electrode 375 in the opening of the pixel defining layer 380. The second electrode 390 may be disposed on the organic light emitting layer 385 and the pixel defining layer 380. Hence, the organic light emitting structure may be provided over the semiconductor device in the pixel region II.

As described above, the organic light emitting display device 300 may include the capacitor disposed in the transparent region I, such that the organic light emitting display device 300 may have a sufficient capacitance for the components by adjusting the dimensions of the capacitor without reducing the transmittance thereof.

FIGS. 18 to 21 are cross sectional views illustrating a method of manufacturing an organic light emitting display device in accordance with some example embodiments.

Figure 18:
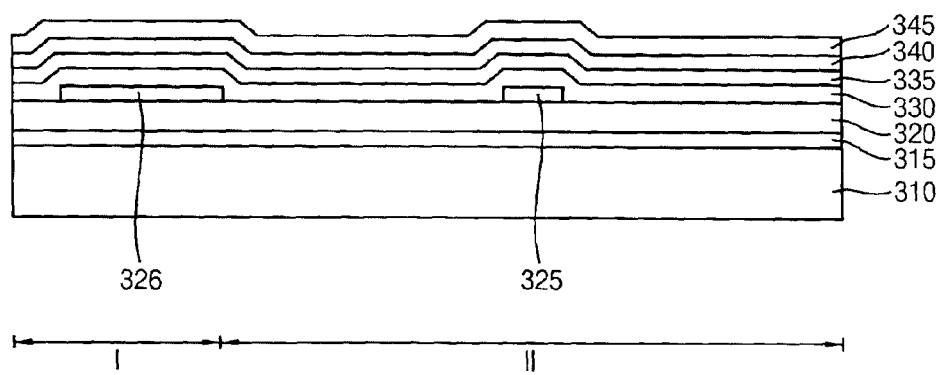
FIGS. 18, 19, 20 and 21 are cross sectional views illustrating a method of manufacturing an organic light emitting display device in accordance with some example embodiments.

Referring to FIG. 18, after successively forming a first buffer layer 315 and a second buffer layer 320 on a substrate 310, an active pattern 325 and a lower electrode 326 may be formed on the second buffer layer 320. The active pattern 325 and the lower electrode 326 may be formed in a pixel region II and a transparent region I. Here, the lower electrode 326 may be formed using polysilicon, and then p+ type impurities may be implanted into the lower electrode 326.

A first gate insulation layer 330 covering the active pattern 325 and the lower electrode 326 may be formed on the second buffer layer 320. A second gate insulation layer 335 may be formed on the first gate insulation layer 330. Alternatively, one of the first and the second gate insulation layers 330 and 335 may be formed on the second buffer layer 320.

A first electrode layer 340 and a second electrode layer 345 may be sequentially formed on the second gate insulation layer 335. For example, the first electrode layer 340 may be formed using a transparent conductive material and the second electrode layer 345 may be formed using metal, alloy, metal nitride, etc.

Figure 19:
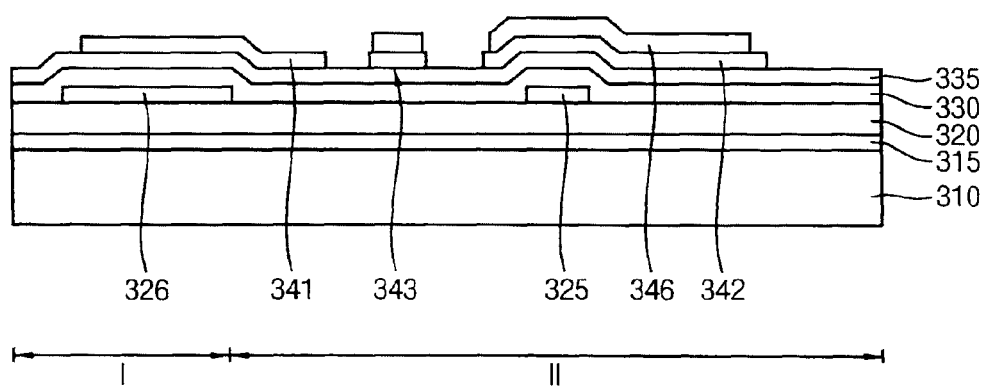

Referring to FIG. 19, the second electrode layer 345 and the first electrode layer 340 may be patterned by an etching process using a halftone mask or a halftone slit mask, so that an upper electrode 341, a first gate electrode 342, a second gate electrode 346 and a wiring 343 may be formed on the second gate insulation layer 335.

A first insulating interlayer 350 may be formed on the second gate insulation layer 335 to cover the upper electrode 341, the second gate electrode 346 and the wiring 343. A second insulating interlayer 355 and a third insulating interlayer 360 may be successively formed on the first insulating interlayer 350. In some example embodiments, one or two of the first to the third insulating interlayers 350, 355 and 360 may be formed on the second gate insulation layer 335.

Portions of the first to the third insulating interlayers 350, 355 and 360 may be etched to form a first contact hole 362 extending to and exposing the second gate electrode 346 and a second contact hole 364 extending to and exposing the upper electrode 341. A connection wiring 365 may be formed on the third insulating interlayer 360, and may extend into the first and the second contact holes 362 and 364 to thereby make contact with the second gate electrode 346 and the upper electrode 341. Although it is not illustrated, a source electrode and a drain electrode may be formed on the third insulating interlayer 360. The source electrode and the drain electrode may pass through the third to the first insulating interlayers 360, 355 and 350 and the second and the first gate insulation layers 335 and 330 to make contact with a source region and a drain region of the active pattern 325, respectively.

Figure 20:
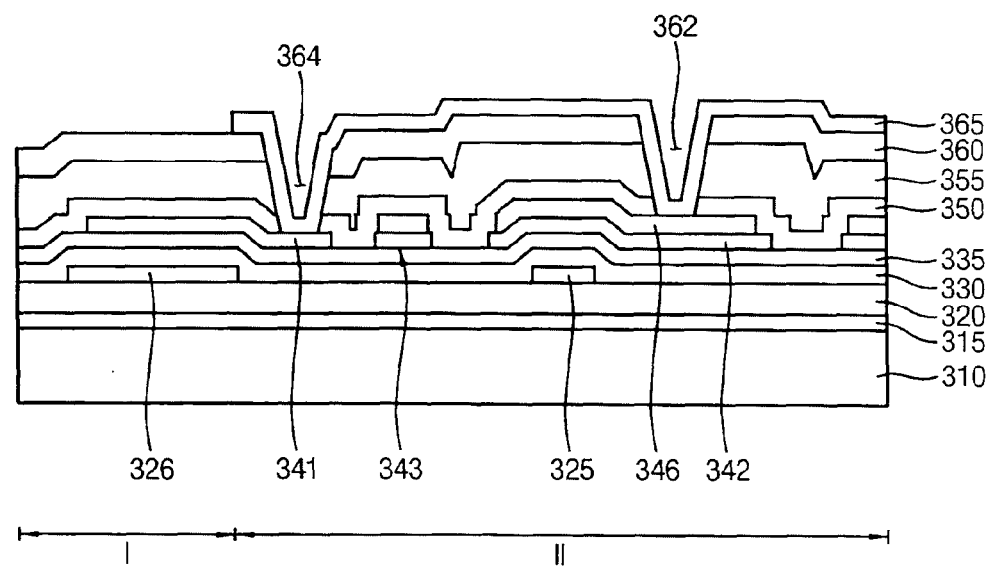

Referring to FIG. 20, a connection wiring 365 may be formed on the third insulating interlayer 360. The connection wiring 365 may extend into a first contact hole 362 and a second contact hole 364 formed through the third to the first insulating interlayers 360, 355 and 350. The first contact hole 362 and the second contact hole 364 may extending to and expose the second gate electrode 346 and the upper electrode 341. Thus, the connection wiring 365 may electrically connect a semiconductor device to a capacitor.

Figure 21:
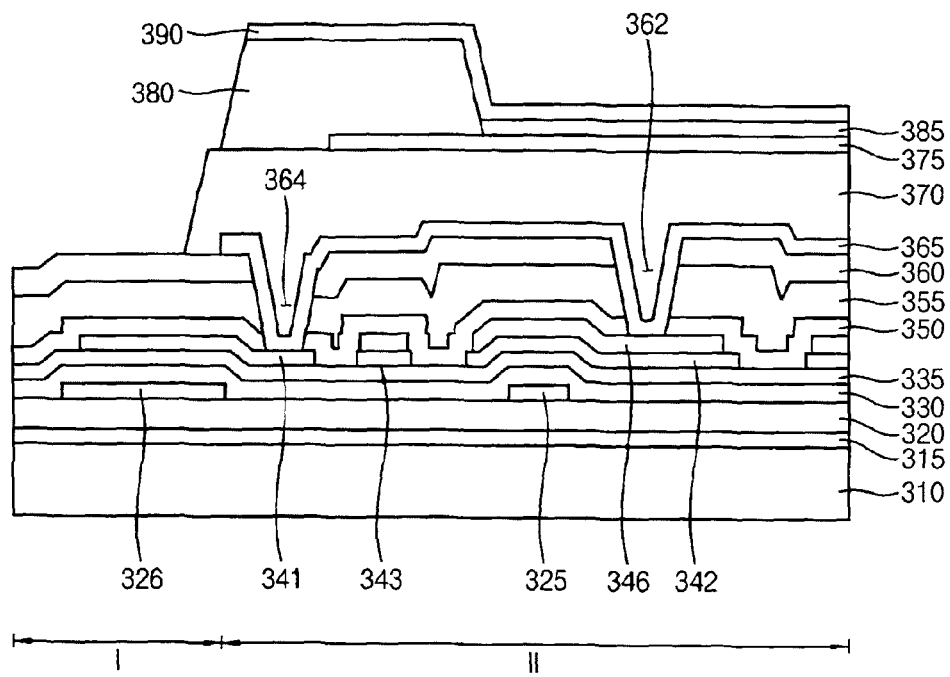

Referring to FIG. 21, an insulation layer 370 covering the connection wiring 365 may be formed on the third insulation layer 360. A first electrode 375 may be formed on the insulation layer 370 in the pixel region II, and then a pixel defining layer 380 may be formed on the first electrode 375 and the insulation layer 370. The pixel defining layer 380 may be partially etched to form an opening that extends to and exposes a portion of the first electrode 375.

An organic light emitting layer 385 may be formed on the exposed portion of the first electrode 375, and a second electrode 390 may be formed on the organic light emitting layer 385 and the pixel defining layer 380. An additional substrate such as a transparent substrate, a window and/or an encapsulation substrate may be formed on the second electrode 390.

Figure 22:
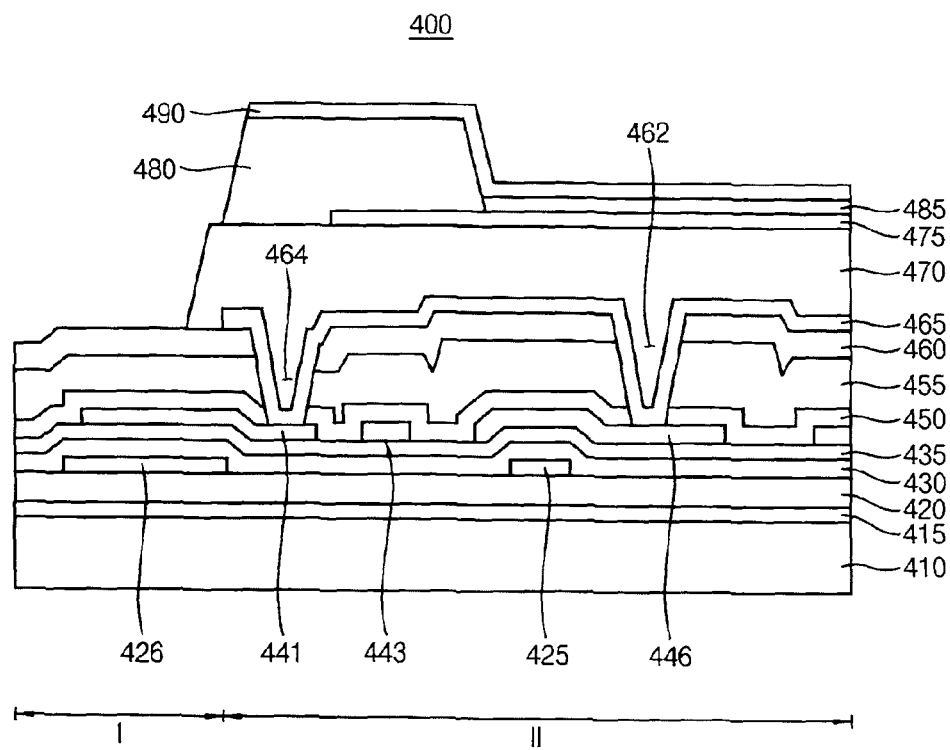
FIG. 22 is a cross sectional view illustrating an organic light emitting display device in accordance with some example embodiments.

FIG. 22 is a cross sectional view illustrating an organic light emitting display device 400 in accordance with some example embodiments. In the organic light emitting display device 400 illustrated in FIG. 22, it will be omitted detailed descriptions of elements substantially the same as those illustrated in FIGS. 1 and 2. The organic light emitting display device 400 in FIG. 22 may have a configuration substantially the same as or similar to that of the organic light emitting display device 300 described with reference to FIG. 17 except for a semiconductor device.

Referring to FIG. 22, the organic light emitting display device 400 may include a semiconductor device, a capacitor and an organic light emitting structure, which are provided on a substrate 410. The capacitor may be located in a transparent region I while the semiconductor device and the organic light emitting structure may be positioned in a pixel region II. Thus, the organic light emitting display device 400 may have a sufficient capacitance without reducing a transmittance thereof while the organic light emitting display device 400 may have a simple configuration.

The semiconductor device may include an active pattern 425, a first gate insulation layer 430, a second gate insulation layer 435, a gate electrode 446, a source electrode (not illustrated) and a drain electrode (not illustrated). That is, the semiconductor device may include a gate structure composed of one gate electrode 446. The organic light emitting structure may include a first electrode 475, an organic light emitting layer 485 and a second electrode 490. The capacitor may include a lower electrode 426, a dielectric structure and an upper electrode 441. In this case, the dielectric structure may include portions of the first and the second gate insulation layers 430 and 435 located in the transparent region I.

The semiconductor device and the capacitor may be arranged on the substrate 410 having a first buffer layer 415 and a second buffer layer 420 thereon. A first insulating interlayer 450, a second insulating interlayer 455 and a third insulating interlayer 460 may be sequentially disposed on the second gate insulation layer 435 to cover the upper electrode 441, a wiring 443 and the gate electrode 446. A first contact hole 462 and a second contact hole 464 may be provided through the first to the third insulating interlayer 450, 455 and 460. The first contact hole 462 may extend to and partially expose the gate electrode 446 and the second contact hole 464 may extend to and partially expose the upper electrode 441. A connection wiring 465 may extend from an upper face of the third insulating interlayer 460 into the first and the second contact holes 462 and 464, so that the connection wiring 465 may contact the gate electrode 446 and the upper electrode 441.

In the pixel region II, an insulation layer 470 covering the connection wiring 465 may be disposed on the third insulating interlayer 460, and the first electrode 475 contacting a drain electrode of the semiconductor device may be located on the insulation layer 470 in the pixel region II. A pixel defining layer 480 having an opening exposing the first electrode 475 may be disposed on the insulation layer 470. The organic light emitting layer 485 may be positioned on the exposed first electrode 475. The second electrode 490 may be located on the organic light emitting layer 485 and the pixel defining layer 480.

FIGS. 23 to 26 are cross sectional views illustrating a method of manufacturing an organic light emitting display device in accordance with some example embodiments.

Figure 23:
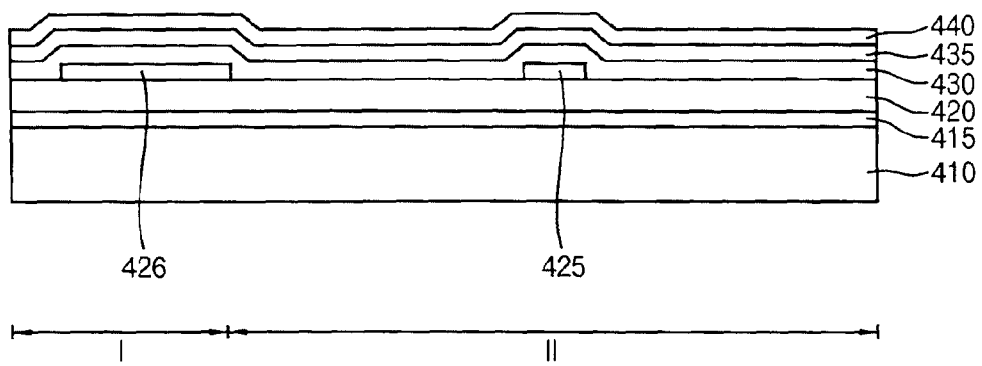
FIGS. 23, 24, 25 and 26 are cross sectional views illustrating a method of manufacturing an organic light emitting display device in accordance with some example embodiments.

Referring to FIG. 23, a first buffer layer 415 and a second buffer layer 420 may be successively formed on a substrate 410, and then an active pattern 425 and a lower electrode 426 may be formed on the second buffer layer 420. The active pattern 425 and the lower electrode 426 may be positioned in a pixel region II and a transparent region I. A first gate insulation layer 430 and a second gate insulation layer 435 may be sequentially formed on the second buffer layer 420 to cover the active pattern 425 and the lower electrode 426.

A first electrode layer 440 may be formed on the second gate insulation layer 435. For example, the first electrode layer 440 may be formed using a transparent material such as indium tin oxide, indium zinc oxide, zinc oxide, tin oxide, gallium oxide, indium oxide, etc.

Figure 24:
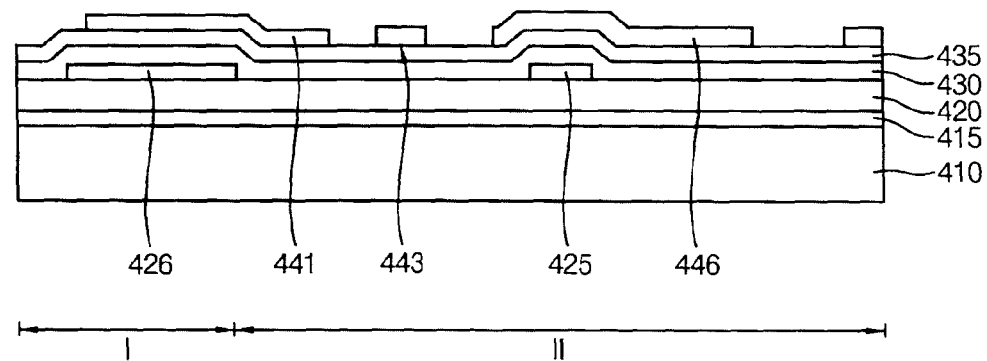

Referring to FIG. 24, the first electrode layer 440 may be patterned to form an upper electrode 441 on a portion of the second gate insulation layer 435 in the transparent region I. Thus, a capacitor including the lower electrode 426, a dielectric structure (i.e., portions of the first and the second gate insulation layers 430 and 435 in the transparent region I) and the upper electrode 441 may be formed in the transparent region I.

A second electrode layer (not illustrated) may be formed on the second gate insulation layer 435 to cover the upper electrode 441, and then the second electrode layer may be patterned to form a gate electrode 446 and a wiring 443 on a portion of the second gate insulation layer 435 in the pixel region II.

Figure 25:
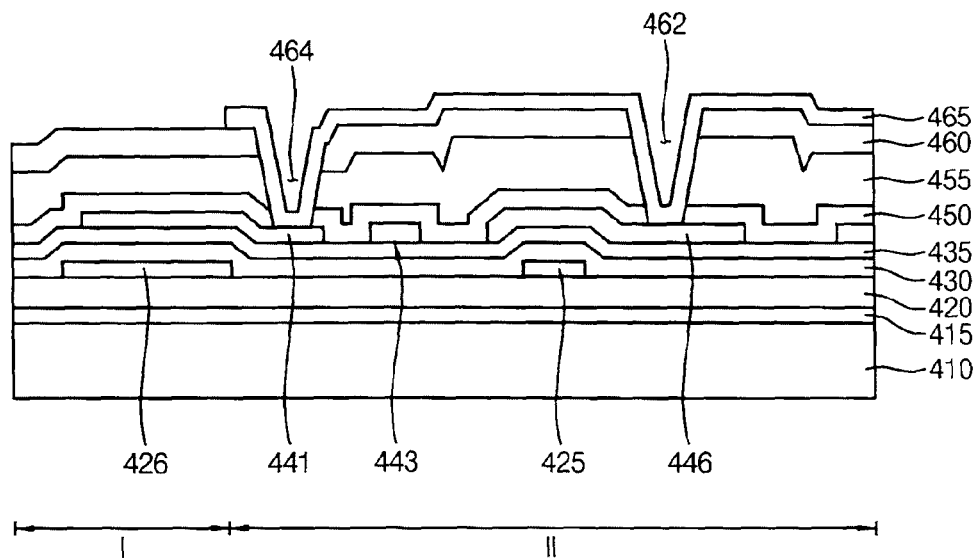

Referring to FIG. 25, a first insulating interlayer 450 may be formed on the second gate insulation layer 435 to cover the upper electrode 441, the wiring 443 and the gate electrode 446. A second insulating interlayer 455 and a third insulating interlayer 460 may be sequentially formed on the first insulating interlayer 450. Alternatively, one or two of the first to the third insulating interlayers 450, 455 and 460 may be formed on the second gate insulation layer 435. Although it is not illustrated, a source electrode and a drain electrode of a semiconductor device may be formed on the third insulating interlayer 460.

The third to the first insulating interlayers 460, 455 and 450 may be partially etched to form a first contact hole 462 extending to and partially exposing the gate electrode 446 and a second contact hole 464 extending to and partially exposing the upper electrode 441. A connection wiring 465 may be formed on the third insulating interlayer 460, a sidewall of the first contact hole 462, an exposed portion of the gate electrode 446, a sidewall of the second contact hole 464 and an exposed portion of the upper electrode 441. Such connection wiring 465 may electrically connect the semiconductor device to the capacitor.

Figure 26:
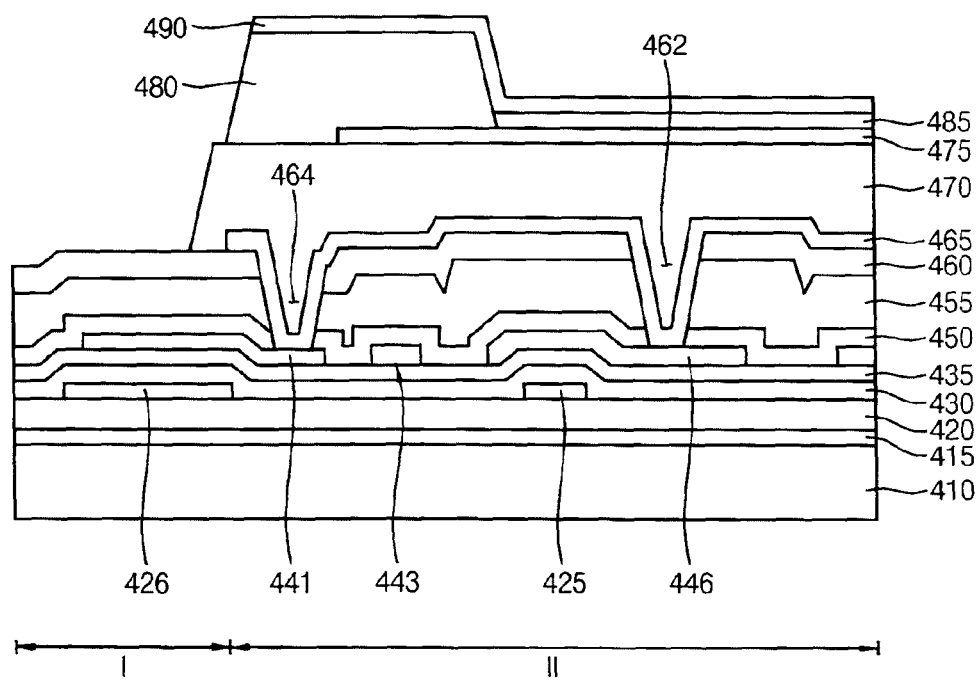

Referring to FIG. 26, an insulation layer 470 may be formed on the third insulating interlayer 460 to cover the connection wiring 465. A first electrode 475 may be formed on the insulation layer 470, and then a pixel defining layer 480 may be formed on the insulation layer 470 to cover the first electrode 475. The pixel defining layer 480 may be partially etched to form an opening that extends to and exposes a portion of the first electrode 475. An organic light emitting layer 485 may be formed on the exposed portion of the first electrode 475, and then a second electrode 490 may be formed on the organic light emitting layer 485 and the pixel defining layer 480. Additionally, a transparent substrate, a window and/or an encapsulation substrate may be formed on the second electrode 490.

The organic light emitting display device according to example embodiments may be employed in various electric or electronic apparatuses. For example, the organic light emitting display device having the above-described configuration may be employed in a display apparatuses for automobiles, aircrafts, vessels, portable electronic appliances, display apparatuses for various goods and/or information, display apparatuses for medical use, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
    a substrate having a pixel region and a transparent region;
    a first capacitor disposed in the transparent region of the substrate;
    a semiconductor device disposed in the pixel region of the substrate;
    a second capacitor disposed on the semiconductor device; and
    an organic light emitting structure disposed on the second capacitor.

2. The organic light emitting display device of claim 1, wherein the semiconductor device comprises:
   an active pattern disposed on the substrate;
   a gate insulation layer disposed on the active pattern, the gate insulation layer extending to the transparent region;
   a gate structure disposed on the gate insulation layer;
   a source electrode contacting a source region of the active pattern; and
   a drain electrode contacting a drain region of the active pattern.

3. The organic light emitting display device of claim 2, wherein the first capacitor comprises:
   a first lower electrode disposed on the substrate;
   a first dielectric structure disposed on the first lower electrode; and
   a first upper electrode disposed on the first dielectric structure.

4. The organic light emitting display device of claim 3, wherein the first lower electrode includes polysilicon doped with impurities.

5. The organic light emitting display device of claim 3, wherein the first dielectric structure includes a portion of the gate insulation layer positioned in the transparent region.

6. The organic light emitting display device of claim 3, wherein the gate structure of the semiconductor device comprises a first gate electrode disposed on the gate insulation layer, and a second gate electrode disposed on the first gate electrode.

7. The organic light emitting display device of claim 6, wherein the first upper electrode includes a material same as a material of the first gate electrode.

8. The organic light emitting display device of claim 3, wherein the second capacitor comprises:
   a second lower electrode;
   a second dielectric structure disposed on the second lower electrode; and
   a second upper electrode disposed on the second dielectric structure.

9. The organic light emitting display device of claim 8, wherein the second lower electrode of the second capacitor is the gate structure of the semiconductor device.

10. The organic light emitting display device of claim 8, wherein the second dielectric structure includes a portion of an insulating interlayer disposed on the gate structure.

11. The organic light emitting display device of claim 1, further comprising:
    at least one insulating interlayer disposed on the second capacitor; and
    a first connection wiring disposed on the at least one insulating interlayer, wherein the first connection wiring electrically connects the semiconductor device to the first capacitor.

12. The organic light emitting display device of claim 11, further comprising a second connection wiring disposed on the at least one insulating interlayer, wherein the second connection wiring is adjacent to the first connection wiring and the second connection wiring electrically connects the first capacitor to the second capacitor.

13. A method of manufacturing an organic light emitting display device, which comprises:
    providing a substrate having a pixel region and a transparent region;
    forming a semiconductor device in the pixel region of the substrate;
    forming a first capacitor in the transparent region of the substrate;
    forming a second capacitor on the semiconductor device; and
    forming an organic light emitting structure on the second capacitor.

14. The method of manufacturing an organic light emitting display device of claim 13, wherein forming of the semiconductor device and forming of the first capacitor comprise:
    forming an active pattern of the semiconductor device and a first lower electrode of the capacitor on the substrate;
    forming a gate insulation layer on the active pattern and the first lower electrode;
    forming a first upper electrode of the first capacitor on the gate insulation layer in the transparent region; and
    forming a gate structure of the semiconductor device on the gate insulation layer in the pixel region.

15. The method of manufacturing an organic light emitting display device of claim 14, wherein forming of the first upper electrode of the first capacitor and forming of the gate structure of the semiconductor device comprise:
    forming a first electrode layer on the gate insulation layer;
    forming a second electrode layer on the first electrode layer; and
    etching the first electrode layer and the second electrode layer.

16. The method of manufacturing an organic light emitting display device of claim 14, wherein forming of the first upper electrode of the first capacitor and forming of the gate structure of the semiconductor device comprise:
    forming a first electrode layer on the gate insulation layer;
    forming the first upper electrode by patterning the first electrode layer;
    forming a second electrode layer on the gate insulation layer; and
    forming the gate structure by patterning the second electrode layer.

17. The method of manufacturing an organic light emitting display device of claim 14, wherein forming of the second capacitor comprises:
    forming an insulating interlayer on the gate structure; and
    forming a second upper electrode on the insulating interlayer.

18. The method of manufacturing an organic light emitting display device of claim 13, further comprising:
    forming at least one insulating interlayer on the second capacitor; and
    forming a first connection wiring on the at least one insulating interlayer, wherein the first connection wiring electrically connects the semiconductor device to the first capacitor.

19. The method of manufacturing an organic light emitting display device of claim 18, wherein forming the first connection wiring comprises:
    forming a first contact hole and a second contact hole through the at least one insulating interlayer, the first contact hole exposing the gate structure and the second contact hole exposing the first upper electrode; and
    forming the first connection wiring on the gate structure exposed through the first contact hole, a sidewall of the first contact hole, the first upper electrode exposed through the second contact hole, a sidewall of the second contact hole, and the at least one insulating interlayer.

20. The method of manufacturing an organic light emitting display device of claim 18, further comprising forming a second connection wiring on the at least one insulating interlayer, wherein the second connection wiring electrically connects the first capacitor to the second capacitor.

\* \* \* \* \*